United States Patent
Park et al.

(10) Patent No.: US 12,527,083 B2
(45) Date of Patent: Jan. 13, 2026

(54) DISPLAY DEVICE INCLUDING CONNECTION WIRE AND METHOD FOR MANUFACTURING THE SAME

(71) Applicant: SAMSUNG DISPLAY CO., LTD., Yongin-si (KR)

(72) Inventors: Chan Jae Park, Suwon-si (KR); Sang Duk Lee, Yongin-Si (KR); Hyun A Lee, Seoul (KR); Dae Hwan Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 630 days.

(21) Appl. No.: 17/626,198

(22) PCT Filed: Jun. 26, 2020

(86) PCT No.: PCT/KR2020/008404
§ 371 (c)(1),
(2) Date: Jan. 11, 2022

(87) PCT Pub. No.: WO2021/010616
PCT Pub. Date: Jan. 21, 2021

(65) Prior Publication Data
US 2022/0278088 A1    Sep. 1, 2022

(30) Foreign Application Priority Data
Jul. 12, 2019    (KR) .......................... 10-2019-0084765

(51) Int. Cl.
*H10D 86/40*    (2025.01)
*H01L 23/00*    (2006.01)
(Continued)

(52) U.S. Cl.
CPC ........... *H10D 86/441* (2025.01); *H01L 24/05* (2013.01); *H01L 24/13* (2013.01); *H01L 24/16* (2013.01);
(Continued)

(58) Field of Classification Search
CPC ......... H01L 25/18; H01L 24/16; H01L 24/06; H01L 2224/02125; H01L 2224/02145;
(Continued)

(56) References Cited

U.S. PATENT DOCUMENTS

2004/0099959 A1    5/2004    Tang
2006/0146214 A1    7/2006    Hwang et al.
(Continued)

FOREIGN PATENT DOCUMENTS

CN    105739198    7/2016
CN    106486605 A    3/2017
(Continued)

OTHER PUBLICATIONS

International Search Report issued in corresponding application No. PCT/KR2020/008404 on Oct. 7, 2020.
(Continued)

*Primary Examiner* — Norman D Richards
*Assistant Examiner* — Laura M Dykes
(74) *Attorney, Agent, or Firm* — F. CHAU & ASSOCIATES, LLC

(57) ABSTRACT

A display panel comprising a display substrate having a display area and a pad area disposed around the display area. A connection wire is disposed on the pad area of the display substrate. A signal wire is disposed on the connection wire. A supporter is disposed between the display substrate and the connection wire. The connection wire directly contacts the supporter.

26 Claims, 29 Drawing Sheets

(51) Int. Cl.
  *H01L 25/00* (2006.01)
  *H01L 25/18* (2023.01)
  *H10K 59/131* (2023.01)
  *H10K 59/12* (2023.01)

(52) U.S. Cl.
  CPC .............. *H01L 24/81* (2013.01); *H01L 25/18* (2013.01); *H01L 25/50* (2013.01); *H10K 59/131* (2023.02); *H01L 24/06* (2013.01); *H01L 24/14* (2013.01); *H01L 24/73* (2013.01); *H01L 2224/02125* (2013.01); *H01L 2224/02145* (2013.01); *H01L 2224/05018* (2013.01); *H01L 2224/05073* (2013.01); *H01L 2224/05553* (2013.01); *H01L 2224/05558* (2013.01); *H01L 2224/05568* (2013.01); *H01L 2224/05573* (2013.01); *H01L 2224/0615* (2013.01); *H01L 2224/13006* (2013.01); *H01L 2224/13013* (2013.01); *H01L 2224/13082* (2013.01); *H01L 2224/1415* (2013.01); *H01L 2224/16148* (2013.01); *H01L 2224/73204* (2013.01); *H01L 2224/81007* (2013.01); *H01L 2224/81205* (2013.01); *H10K 59/1201* (2023.02)

(58) Field of Classification Search
  CPC . H01L 2224/05073; H01L 2224/05553; H01L 2224/05558; H01L 2224/05568; H01L 2224/13013; H01L 2224/13082; H01L 2224/73204; H01L 2224/81007; H01L 2224/81205; H01L 27/1244; H10K 59/131
  USPC ......................................................... 257/737
  See application file for complete search history.

(56) References Cited

U.S. PATENT DOCUMENTS

| | | | |
|---|---|---|---|
| 2007/0290306 A1 | 12/2007 | Muramatsu et al. | |
| 2012/0211900 A1* | 8/2012 | Choi | H01L 23/49811 |
| | | | 438/666 |
| 2016/0197097 A1* | 7/2016 | Kim | H10K 59/1275 |
| | | | 257/40 |
| 2017/0062548 A1* | 3/2017 | Han | H01L 29/41733 |
| 2017/0250199 A1* | 8/2017 | Odaka | G02F 1/13458 |
| 2018/0061748 A1 | 3/2018 | Kim et al. | |
| 2018/0061855 A1 | 3/2018 | Min et al. | |
| 2018/0068931 A1 | 3/2018 | Ha et al. | |
| 2018/0076151 A1 | 3/2018 | Min et al. | |
| 2018/0358413 A1* | 12/2018 | Lee | G06F 3/04164 |
| 2019/0131379 A1 | 5/2019 | Won et al. | |
| 2021/0033902 A1* | 2/2021 | Shiina | G02F 1/13458 |
| 2021/0408207 A1* | 12/2021 | Shu | H05K 1/189 |

FOREIGN PATENT DOCUMENTS

| | | | |
|---|---|---|---|
| CN | 107132708 A | | 9/2017 |
| CN | 107180848 A | | 9/2017 |
| CN | 109003997 A | | 12/2018 |
| JP | 06-177214 | | 6/1994 |
| JP | 2005-070360 | | 3/2005 |
| JP | 2008-116795 | | 5/2008 |
| JP | 2008-135486 | | 6/2008 |
| JP | 2008-277646 | | 11/2008 |
| JP | 2008277647 A | * | 11/2008 |
| JP | 2009-162888 | | 7/2009 |
| JP | 5324121 | | 10/2013 |
| KR | 10-0368776 | | 1/2003 |
| KR | 10-2016-0083993 A | | 7/2016 |
| KR | 10-2017-0038406 | | 4/2017 |
| KR | 10-2017-0081052 | | 7/2017 |
| KR | 10-2017-0141840 | | 12/2017 |
| KR | 10-2018-0000046 | | 1/2018 |
| KR | 10-2018-0070774 | | 6/2018 |

OTHER PUBLICATIONS

Office Action issued in corresponding Japanese Application No. JP 2022-501069 on Apr. 2, 2024.

Extended European Search Report issued in corresponding European Application No. EP 20840013.5 on Aug. 1, 2023.

\* cited by examiner

FIG. 5
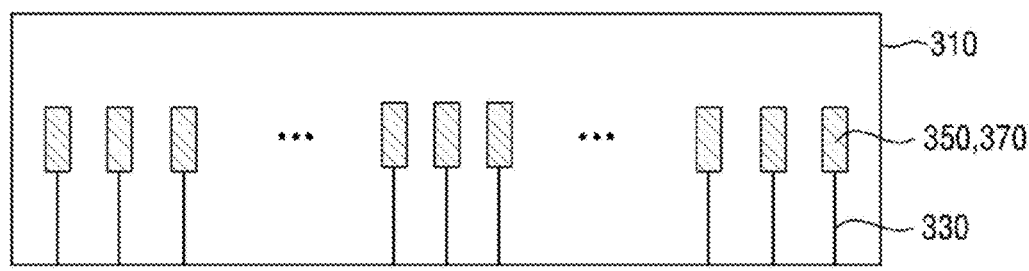
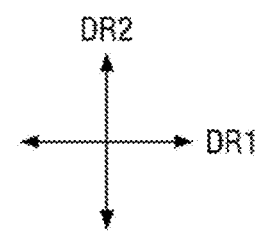

FIG. 6
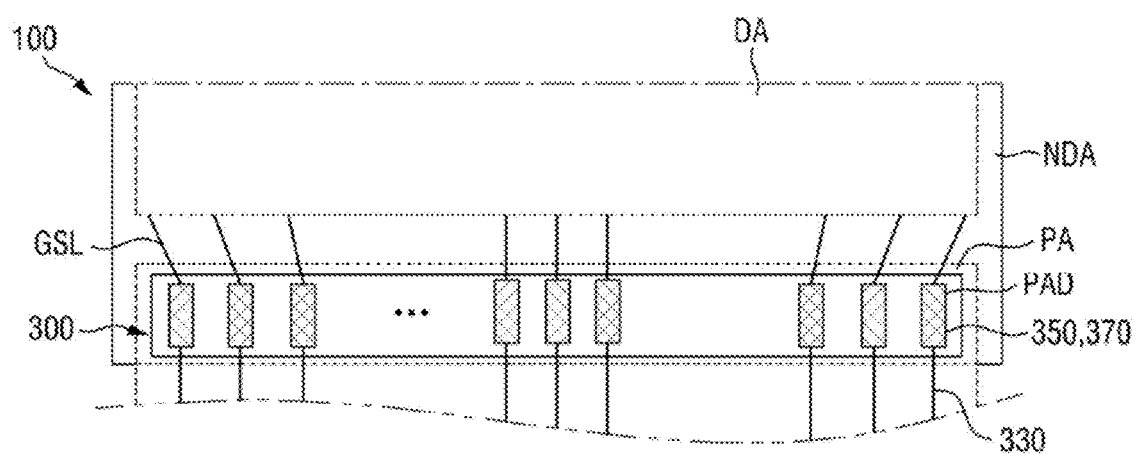
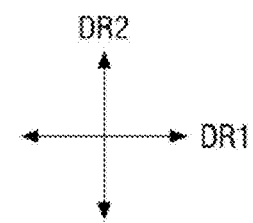

FIG. 29
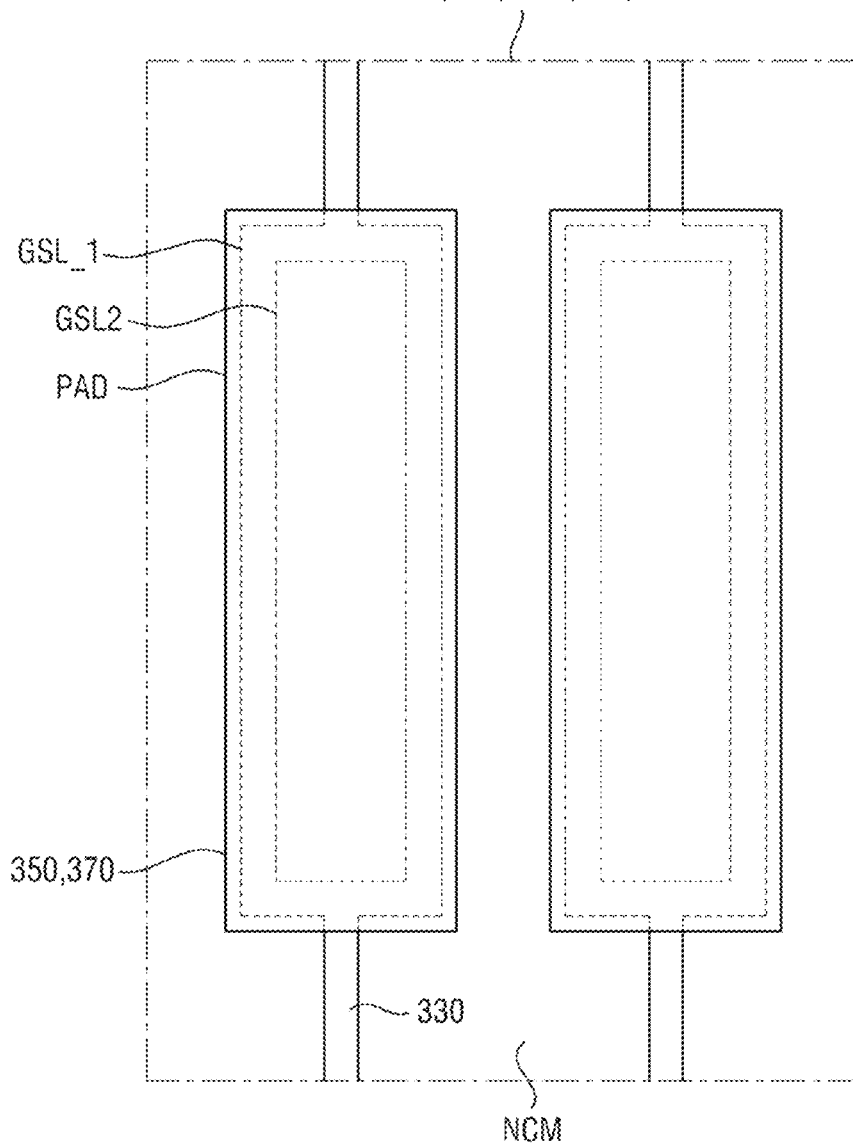
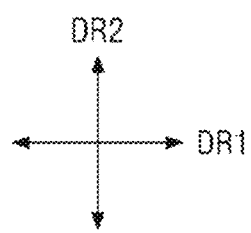

DISPLAY DEVICE INCLUDING CONNECTION WIRE AND METHOD FOR MANUFACTURING THE SAME

CROSS-REFERENCE TO RELATED APPLICATIONS

This application is a national stage entry of International Application Number PCT/KR2020/008404, filed on Jun. 26, 2020, which claims priority to Korean Patent Application No. 10-2019-0084765, filed on Jul. 12, 2019 in the Korean Intellectual Property Office, the disclosures of which are incorporated by reference herein in their entireties.

1. TECHNICAL FIELD

The present invention relates to a display device and a method of manufacturing the display device.

2. DISCUSSION OF RELATED ART

Display devices are devices for visually displaying data. The display devices each include a substrate divided into a display area DA and a non-display area NDA. Pixels are disposed on the substrate in the display area DA, and pads and the like are disposed on the substrate in the non-display area NDA. On the pads, a driving circuit and the like are mounted and transmit a driving signal to the pixels.

The driving circuit includes a plurality of bumps, and each of the bumps may be bonded to the pads separated from each other.

SUMMARY

The present invention is directed to providing a display device in which bonding reliability between a pad and a bump may be increased.

It should be noted that objects of the present invention are not limited to the above-described technical objects, and other technical objects of the present invention will be apparent to those skilled in the art from the following descriptions.

One aspect of the present invention provides a display panel including a display substrate having a display area and a pad area disposed around the display area, a connection wire disposed on the pad area of the display substrate, a signal wire disposed on the connection wire, and a supporter disposed between the display substrate and the connection wire. The connection wire directly contacts the supporter.

In an embodiment, a planar size of the connection wire may be greater than a planar size of the supporter, and the connection wire may cover the supporter.

In an embodiment, a planar size of the signal wire may be greater than the planar size of the connection wire, and the signal wire may directly contact the connection wire.

In an embodiment, the display panel may further include an insulating layer disposed between the display substrate and the signal wire. The insulating layer may cover a side surface of the connection wire and expose an upper surface thereof.

In an embodiment, the signal wire may directly contact an upper surface of the insulating layer.

In an embodiment, a cross-sectional shape of the supporter may include at least one selected from a trapezoidal shape, a triangular shape, a pentagonal shape, a semicircular shape, a semi-elliptical shape, and a quadrangular shape.

In an embodiment, the supporter may include a plurality of patterns extending along a long-side direction of the signal wire and spaced apart from each other along a short-side direction of the signal wire.

In an embodiment, the supporter may include a plurality of patterns extending along a short-side direction of the signal wire and spaced apart from each other along a long-side direction of the signal wire.

In an embodiment, the supporter may have a lattice shape extending along a long-side direction and a short-side direction of the signal wire in a plan view.

In an embodiment, the supporter may have a shape of a plurality of islands disposed to be spaced apart along a long-side direction and a short-side direction of the signal wire in a plan view.

In an embodiment, the connection wire may include a plurality of connection wires, and the display panel may further include a non-conductive film or a non-conductive paste disposed between the plurality of connection wires.

Another aspect of the present invention provides a display panel including a display substrate having a display area and a pad area disposed around the display area, a first connection wire disposed on the pad area of the display substrate, and a signal wire disposed on the first connection wire. The first connection wire includes a first portion, a second portion disposed on a first side of the first portion, and a third portion disposed on a second side of the first portion that is opposite to the first side. A surface height of the first portion is greater than a surface height of the second portion and a surface height of the third portion.

In an embodiment, the first connection wire may include a fourth portion disposed to overlap a first portion of the signal wire, a fifth portion disposed to overlap a second portion of the signal wire, and a sixth portion disposed to overlap a third portion of the signal wire. A thickness of the fourth portion may be greater than a thickness of each of the fifth portion and the sixth portion.

In an embodiment, the display panel may further include a second connection wire disposed between the first connection wire and the signal wire. A planar size of the second connection wire may be less than a planar size of the first connection wire and a planar size of the signal wire, and the second connection wire may be disposed to overlap a first portion of the signal wire in a thickness direction.

Still another aspect of the present invention provides a display device including a display panel including a display substrate having a display area and a pad area disposed around the display area, a connection wire disposed on the pad area of the display substrate, a signal wire disposed on the connection wire, and a supporter disposed between the display substrate and the connection wire, and a driving integrated circuit attached on the pad area of the display substrate and including a bump connected to the signal wire. The connection wire directly contacts the supporter.

In an embodiment, a planar size of the connection wire may be greater than a planar size of the supporter, and the connection wire may cover the supporter.

In an embodiment, a planar size of the signal wire may be greater than a planar size of the connection wire, and the signal wire may directly contact the connection wire.

In an embodiment, the display device may further include an insulating layer disposed between the display substrate and the signal wire. The insulating layer may cover a side surface of the connection wire and expose an upper surface thereof.

In an embodiment, the signal wire may directly contact an upper surface of the insulating layer.

In an embodiment, the signal wire may include a first portion disposed to overlap the supporter, a second portion disposed not to overlap the supporter and located on a first side of the first portion, and a third portion disposed not to overlap the supporter and located on a second side of the first portion that is opposite to the first side. An upper surface of the first portion may protrude further from the display substrate than an upper surface of the second portion and an upper surface of the third portion in a thickness direction.

In an embodiment, the driving integrated circuit may further include a driving substrate and a driving wire disposed on the driving substrate, and the bump may be disposed on the driving wire and connected to the driving wire.

In an embodiment, the bump may include a first portion, a second portion disposed on a first side of the first portion, and a third portion disposed on a second side of the first portion that is opposite to the first side. A surface of the first portion may be indented further than a surface of the second portion and a surface of the third portion in the thickness direction.

In an embodiment, the first portion of the signal wire may be connected to the first portion of the bump, the second portion of the signal wire may be connected to the second portion of the bump, and the third portion of the signal wire may be connected to the third portion of the bump.

In an embodiment, the bump may be directly connected to the signal wire.

In an embodiment, the bump may be ultrasonically connected to the signal wire.

Yet another aspect of the present invention provides a method of manufacturing a display device, the method including forming a supporter on a base substrate, forming a connection wire on the supporter, and forming a signal wire on the connection wire. The signal wire covers the connection wire and is electrically connected to the connection wire. The connection wire may cover the supporter and may directly contact the supporter.

In an embodiment, the forming of the supporter on the base substrate may include forming the supporter through one process selected from a photolithography process, an inkjet process, or a squeezing process.

In an embodiment, the method may further include attaching a driving integrated circuit onto the signal wire after the forming of the signal wire on the connection wire.

In an embodiment, the attaching of the driving integrated circuit may include directly connecting a bump of the driving integrated circuit to the signal wire.

In an embodiment, the signal wire may include a first portion disposed to overlap the supporter, a second portion disposed not to overlap the supporter and located on a first side of the first portion, and a third portion disposed not to overlap the supporter and located on a second side of the first portion that is opposite to the first side. An upper surface of the first portion may protrude further from the base substrate than an upper surface of the second portion and an upper surface of the third portion in a thickness direction.

In an embodiment, the bump may include a first portion, a second portion disposed on a first side of the first portion, and a third portion disposed on a second side of the first portion that is opposite to the first side. A surface of the first portion may be indented further than a surface of the second portion and a surface of the third portion in the thickness direction.

In an embodiment, the first portion of the signal wire may be connected to the first portion of the bump, the second portion of the signal wire may be connected to the second portion of the bump, and the third portion of the signal wire may be connected to the third portion of the bump.

Another aspect of the present invention provides a display panel including a display substrate having a display area and a pad area disposed around the display area. A connection wire is disposed on the pad area of the display substrate. A supporter is disposed between the display substrate and the connection wire and directly contacts the connection wire. The supporter protrudes a first portion of the connection wire in a direction further from the display substrate. A signal wire is disposed on the connection wire and includes a first portion that overlaps the first portion of the connection wire. The first portion of the connection wire protrudes the first portion of the signal wire in the direction further from the display substrate. A driving integrated circuit is attached on the pad area of the display substrate and includes a bump directly connected to the signal wire.

In an embodiment, the bump is ultrasonically connected to the signal wire.

According to embodiments of the present invention, a display device having high bonding reliability can be provided.

Effects according to the present invention are not limited by the contents illustrated above, and more various effects are included in the present specification.

BRIEF DESCRIPTION OF THE DRAWINGS

FIG. 5 is a plan layout view of a driving integrated circuit according to one embodiment.

FIG. 6 is a plan layout view of the pad area of the display panel to which the driving integrated circuit is attached.

FIG. 29 is a plan layout view of a pad area of a display panel to which a driving integrated circuit according to an embodiment is attached.

DETAILED DESCRIPTION OF EMBODIMENTS

Display devices are devices for displaying a video or a still image. The display devices may be used for implementing display screens of various kinds of products such as televisions, notebook computers, monitors, digital signage, and Internet of Things (IoT) devices, as well as portable electronic devices such as mobile phones, smartphones, tablet personal computers (PCs), smart watches, watch phones, mobile communication terminals, electronic organizers, electronic books, portable multimedia players (PMPs), navigation devices, and ultra-mobile PCs (UMPCs).

Hereinafter, embodiments of the present invention will be described with reference to the accompanying drawings.

Figure 1:
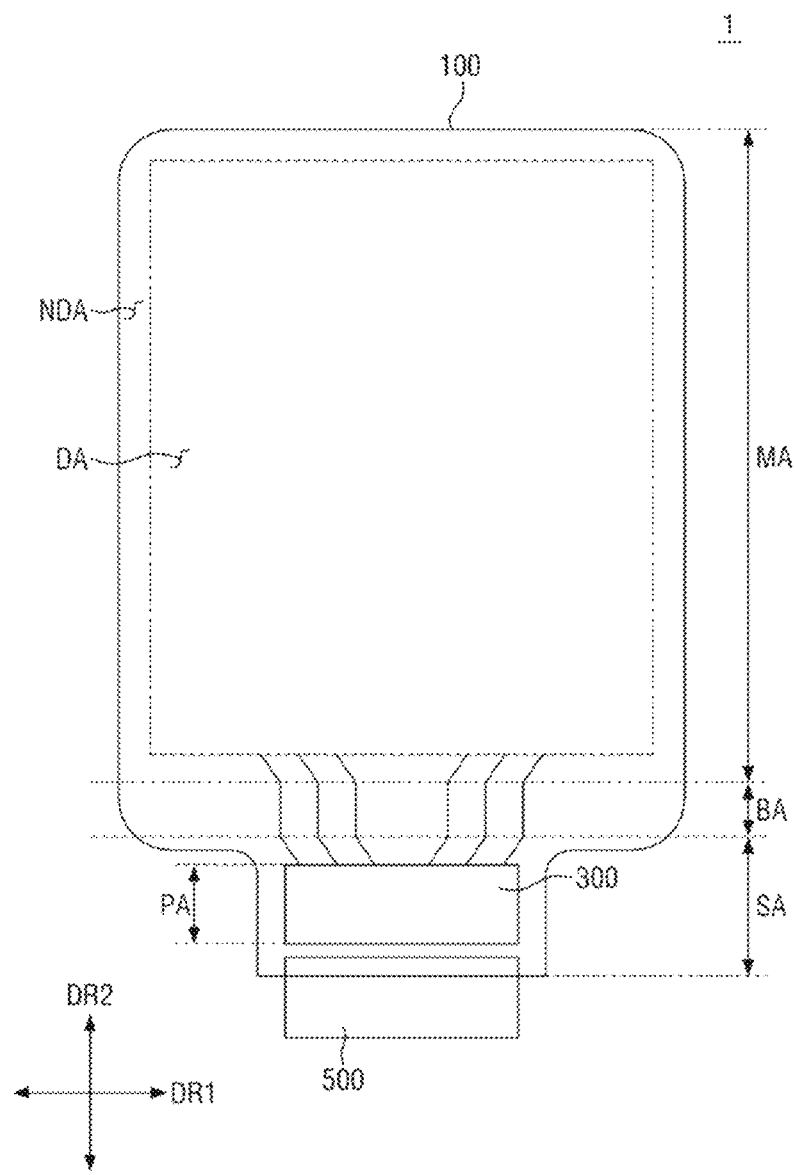
FIG. 1 is a plan layout view of a display device according to one embodiment.
Figure 2:
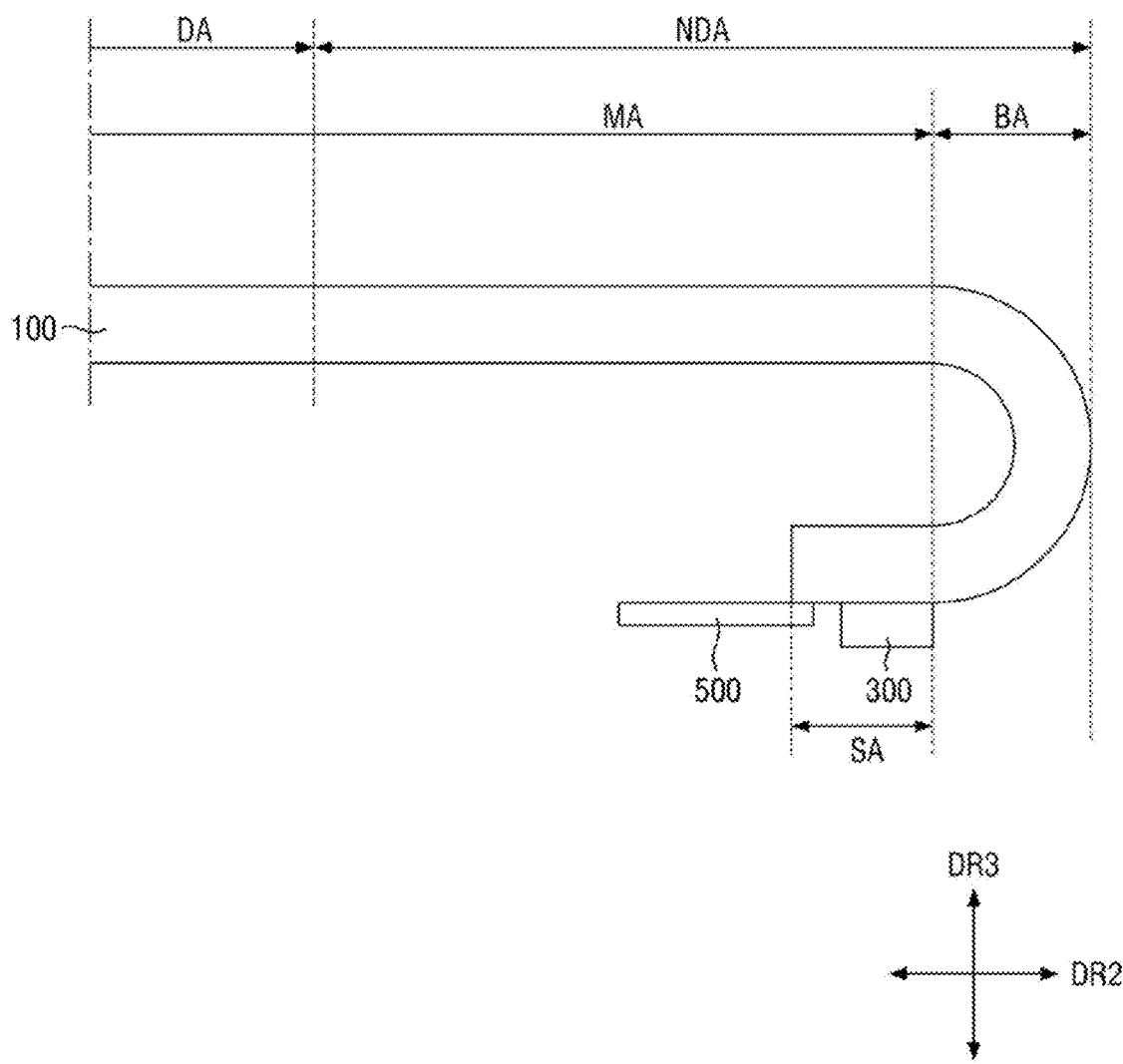
FIG. 2 is a schematic partial cross-sectional view when the display device according to one embodiment is bent.

FIG. 1 is a plan layout view of a display device according to one embodiment, and FIG. 2 is a schematic partial cross-sectional view of the display device according to one embodiment.

Referring to FIGS. 1 and 2, a display device 1 includes a display area DA that displays an image and a non-display area NDA disposed around the display area DA. The display area DA may have a rectangular shape in which each corner has a right angle in a plan view or a rectangular shape in which each corner is rounded in a plan view. A planar shape of the display area DA is not limited to the rectangular shape and may be a circular shape, an elliptical shape, or various other shapes. The display area DA includes a plurality of pixels. A detailed cross-sectional structure of the pixel will be described below.

The non-display area NDA is disposed around the display area DA. The non-display area NDA may be disposed adjacent to both short sides of the display area DA. In addition, the non-display area NDA may be disposed adjacent to both long sides of the display area DA in addition to both short sides thereof and may surround all of the sides of the display area DA. That is, the non-display area NDA may form edges of the display area DA.

The display device 1 may include a display panel 100, which displays a screen, and a driving integrated circuit 300 that is attached to the display panel 100 and drives a pixel circuit of the display panel 100. The driving integrated circuit 300 may be implemented as a chip on plastic (COP) in which a driving chip (IC) is applied and which is mounted directly on the display panel 100.

The display panel 100, for example, may be an organic light-emitting display panel. Although the display panel 100 which is an organic light-emitting display panel is exemplified in the following embodiment, the present invention is not limited thereto, and the display panel 100 may be other types of display panels such as a liquid crystal display (LCD) panel, a field emission display (FED) panel, an electrophoretic apparatus, and the like.

In one embodiment, the display panel 100 may include a main area MA and a bending area BA. The main area MA may be flat. In the main area MA, the display area DA and a partial area of the non-display area NDA of the display panel 100 may be disposed.

The bending area BA may be disposed on at least one side of the main area MA. In the drawings, one bending area BA is exemplified as being disposed adjacent to a lower side of the main area MA. However, the bending area BA may be disposed adjacent to other sides such as left, right, and upper sides of the main area MA. In addition, the bending area BA may be disposed on two or more sides of the main area MA.

The bending area BA may be bent in a direction opposite to a display direction (a back surface in the case of a top emission type device). As described above, when at least a portion of the non-display area NDA is bent in the direction opposite to the display direction, a bezel of the display device may be reduced.

The display device 1 may further include a sub area SA extending from the bending area BA. The sub area SA may be parallel to the main area MA. The sub area SA may overlap the main area MA in a thickness direction. The above-described bending area BA and sub area SA may each be in the non-display area NDA, but the present invention is not limited thereto.

The display panel 100 may include a pad area PA disposed in the non-display area NDA. The pad area PA may be located in the sub area SA as exemplified in the drawing. However, the pad area PA is not limited thereto and may be located in the main area MA or the bending area BA. The driving integrated circuit 300 may be attached to the pad area PA of the display panel 100.

A plurality of signal wires are disposed in the pad area PA of the non-display area NDA. The plurality of signal wires may be connected to at least one thin-film transistor of the pixel in the display area DA through a connection wire electrically connected to the thin-film transistor. The connection wire may be disposed across the display area DA and the non-display area NDA. Bumps of the driving integrated circuit 300 may be connected to the plurality of signal wires.

The display device may further include a printed circuit board 500 attached to the display panel 100. The printed circuit board 500 may be attached to the outside of the pad area PA of the display panel 100 in the non-display area NDA. That is, the pad area PA to which the driving integrated circuit 300 is attached may be disposed between the display area DA and an area to which the printed circuit board 500 are attached. The printed circuit board 500 may be attached to an end portion of a lower surface of the sub area SA. The printed circuit board 500 may be a flexible printed circuit board (FPCB). However, the printed circuit board 500 is not limited thereto and may be connected to the display panel 100 through a flexible film.

Figure 3:
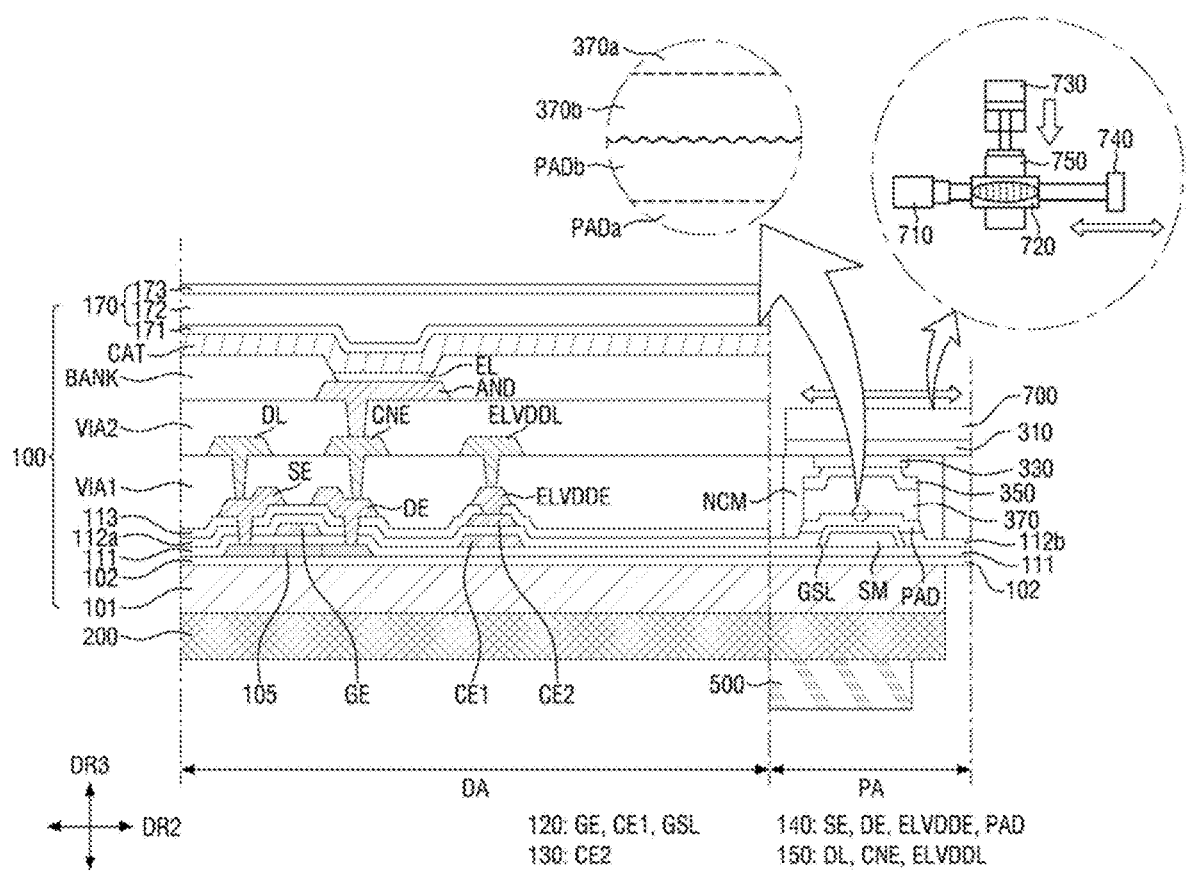
FIG. 3 is a cross-sectional view of one pixel and a pad area according to one embodiment.

FIG. 3 is a cross-sectional view of one pixel and the pad area according to one embodiment.

Referring to FIG. 3, the display device 1 further includes a panel bottom sheet 200 disposed below the display panel 100. The panel bottom sheet 200 may be attached to a back surface of the display panel 100. The panel bottom sheet 200 includes at least one functional layer. The functional layer may be a layer that performs a heat dissipation function, an electromagnetic wave shielding function, a grounding function, a buffering function, a strength reinforcing function, a supporting function, and/or a digitizing function. The functional layer may be a sheet layer formed of a sheet, a film layer formed of a film, a thin film layer, a coating layer, a panel, a plate, or the like. One functional layer may be formed of a single layer or formed of a plurality of stacked thin films or coating layers. The functional layer may be, for example, a support substrate, a heat dissipation layer, an electromagnetic wave shielding layer, a shock-absorbing layer, a digitizer, or the like.

The display panel 100 may include a display substrate 101, a plurality of conductive layers, a plurality of insulating layers insulating the plurality of conductive layers, an organic layer EL, and the like.

The display substrate 101 is disposed across the entirety of the display area DA and the non-display area NDA. The display substrate 101 may perform a function of supporting various elements disposed thereabove. In one embodiment, the display substrate 101 may be a rigid substrate including a rigid material such as flexible glass, quartz, or the like. However, the display substrate 101 is not limited thereto and may be a flexible substrate including a flexible material such as polyimide (PI) or the like.

A buffer layer 102 may be disposed on the display substrate 101. The buffer layer 102 may prevent moisture and oxygen from penetrating from the outside through the display substrate 101. The buffer layer 102 may include one of a silicon nitride ($SiN_x$) film, a silicon oxide ($SiO_2$) film, and a silicon oxynitride ($SiO_xN_y$) film.

A semiconductor layer 105 may be disposed on the buffer layer 102. The semiconductor layer 105 forms a channel of a thin-film transistor. The semiconductor layer 105 may be disposed in each pixel of the display area DA and may be disposed even in the non-display area NDA in some cases. The semiconductor layer 105 may include a source/drain area and an active area. The semiconductor layer 105 may include polycrystalline silicon.

A first insulating layer 111 may be disposed on the semiconductor layer 105. The first insulating layer 111 may be disposed over the entire surface of the display substrate 101. The first insulating layer 111 may be a gate insulating film having a gate insulating function. The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. The above materials may be used alone or in combination thereof.

A supporter SM may be disposed on the first insulating layer 111. The supporter SM may be disposed directly on an upper surface of the first insulating layer 111. The supporter SM may be disposed below a connection wire GSL, which will be described below, to protrude the connection wire GSL in the thickness direction. Due to the protruding connection wire GSL, a signal wire PAD may protrude together with the connection wire GSL in the thickness direction to facilitate bonding with the bumps of the driving integrated circuit 300. The supporter SM may include an organic material or an inorganic material.

A cross-sectional shape of the supporter SM may be a trapezoidal shape.

A first conductive layer 120 may be disposed on the first insulating layer 111 and the supporter SM. The first conductive layer 120 may include a gate electrode GE of a thin-film transistor TFT, a first electrode CE1 of a storage capacitor Cst, and the connection wire GSL. The connection wire GSL may be disposed to pass through the display area DA and the pad area PA. The first conductive layer 120 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single film or a stacked film made of the above-exemplified materials.

The connection wire GSL may cover a surface of the supporter SM and may be in direct contact with the surface of the supporter SM. A portion of the connection wire GSL overlapping the supporter SM in the thickness direction may protrude in the thickness direction.

Second insulating layers 112a and 112b may be disposed on the first conductive layer 120. The second insulating layers 112a and 112b may insulate the first conductive layer 120 and a second conductive layer 130 from each other. The second insulating layer 112a may be disposed mainly in the display area DA, and the second insulating layer 112b may be disposed mainly in the pad area PA. The second insulating layers 112a and 112b may be made of a material selected from the exemplified materials of the first insulating layer 111. The second insulating layer 112b may partially expose the connection wire GSL in the pad area PA. The second insulating layer 112b may partially cover a side surface of the connection wire GSL and expose an upper surface and a portion of the remaining side surface thereof.

The second conductive layer 130 may be disposed on the second insulating layers 112a and 112b. The second conductive layer 130 may include a second electrode CE2 of the storage capacitor Cst. A material of the second conductive layer 130 may be selected from the above-exemplified materials of the first conductive layer 120. The first electrode CE1 of the storage capacitor Cst and the second electrode CE2 of the storage capacitor Cst may form a capacitor through the second insulating layers 112a and 112b.

A third insulating layer 113 may be disposed on the second conductive layer 130. The third insulating layer 113 may include at least one of the above-exemplified materials of the first insulating layer 111. In some embodiments, the third insulating layer 113 may include an organic insulating material. The organic insulating material may be selected from exemplified materials of a first via layer VIA1, which will be described below.

A third conductive layer 140 may be disposed on the third insulating layer 113, the second insulating layer 112b, and the connection wire GSL. The third conductive layer 140 may include a source electrode SE, a drain electrode DE, a high-potential voltage electrode ELVDDE, and the signal wire PAD. The third conductive layer 140 may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 140 may be a single film made of a material selected from the above-exemplified materials. The third conductive layer 140 is not limited thereto and may be a stacked film. For example, the third conductive layer 140 may be formed in a stacked structure of Ti/Al/Ti, Mo/Al/Mo, Mo/AlGe/Mo, Ti/Cu, or the like. In one embodiment, the third conductive layer 140 may be formed in a stacked structure of Ti/Al/Ti.

The signal wire PAD of the third conductive layer 140 may be disposed to overlap the connection wire GSL of the first conductive layer 120 in the thickness direction and may be electrically connected to the connection wire GSL through the exposed portion of the second insulating layer 112b. A planar size of the signal wire PAD may be greater than a planar size of the connection wire GSL. The signal wire PAD may cover the connection wire GSL in a plan view, and include a side surface extending further outward than the side surface of the connection wire GSL.

The first via layer VIA1 may be disposed on the third conductive layer 140. The first via layer VIA1 may include an organic insulating material. The organic insulating material may include at least one among an acrylic-based resin (polyacrylate resin), an epoxy resin, a phenolic resin, a polyamide-based resin, a polyimide-based resin, an unsaturated polyester-based resin, a polyphenylene-based resin (polyphenylene ether resin), a polyphenylene sulfide-based resin, and benzocyclobutene (BCB).

The third insulating layer 113 and upper structures of the third conductive layer 140 may be removed or omitted in a partial area of the signal wire PAD on the pad area PA. Accordingly, the omitted or removed structures may expose the signal wire PAD disposed in the pad area PA.

The driving integrated circuit 300 may include a driving substrate 310, a driving wire 330 disposed on the driving substrate 310, and a bump disposed on the driving wire 330. The bump may include a first bump 350 disposed on a surface of the driving wire 330, and a second bump 370 disposed on a surface of the first bump 350.

The driving substrate 310 may include at least one of the exemplified materials of the display substrate 101. The driving substrate 310 may serve to support lower structures of the driving integrated circuit 300.

The driving wire 330 may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The driving wire 330 may be a single film made of a material selected from the above-exemplified materials. The driving wire 330 is not limited thereto and may be a stacked film.

The bump may be bonded to the signal wire PAD of the display panel 100. The first bump 350 may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first bump 350 may be a single film made of a material selected from the above-exemplified materials. The first bump 350 is not limited thereto and may be a stacked film.

The second bump 370 may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second bump 370 may be a single film made of a material selected from the above-exemplified materials. The second bump 370 is not limited thereto and may be a stacked film.

A non-conductive member NCM may be disposed on the periphery of the signal wire PAD and the bump. The non-conductive member NCM may be disposed between adjacent signal wires PAD and between adjacent bumps. The non-conductive member NCM may be disposed between the driving substrate 310 and the second insulating layer 112b. The non-conductive member NCM may be disposed between adjacent signal wires PAD, between adjacent bumps, and between the signal wire PAD and the bump before an ultrasonic bonding process, which will be described below, is performed, and during the ultrasonic bonding process, the non-conductive members NCM located between the signal wire PAD and the bump may be pushed out into an area not overlapping the signal wire PAD and the bump to fill a gap between the adjacent signal wires PAD and a gap between the adjacent bumps together with the non-conductive members NCM located between the adjacent signal wires PAD and between the adjacent bumps.

The non-conductive member NCM may be made of a material having no conductivity or substantially no conductivity. For example, the non-conductive member NCM may include a non-conductive film (NCF) or a non-conductive paste (NCP).

In one embodiment, the bump may be directly connected to the exposed signal wire PAD. For example, the bump may be ultrasonically bonded to the signal wire PAD. Furthermore, the second bump 370 may be directly connected to the signal wire PAD and may be ultrasonically bonded thereto.

The ultrasonic bonding may be performed through an ultrasonic device 700. The ultrasonic device 700 may include a vibration generation part 710, a vibration part 720 connected to the vibration generation part 710, a pressing part 730 configured to amplify a vibration amplitude of the vibration part 720, and a vibration transmitting part 740 connected to the vibration part 720.

The vibration generation part 710 may convert electrical energy into vibration energy. The vibration part 720 may vibrate by the vibration energy converted by the vibration generation part 710. The vibration part 720 may vibrate while having a constant vibration direction and a predetermined amplitude. The amplitude of the vibration part 720 may be amplified in a direction parallel to the vibration direction by the pressing part 730 connected to the vibration part 720. The vibration transmitting part 740 may transmit the vibration of the vibration part 720 to an ultrasonic bonding object. A support part 750 may fix upper and lower surfaces of the vibration part 720 to suppress the vibration part 720 and the vibration transmitting part 740 from moving up and down due to the vibration.

In one embodiment, the ultrasonic device 700 is in contact with the other surface of the driving integrated circuit 300 and maintains a constant pressurized state downward so that the vibration transmitting part 740 efficiently transmits the vibration to the driving integrated circuit 300. In this case, as shown in FIG. 3, the vibration transmitting part 740 of the ultrasonic device 700 may perform the ultrasonic bonding while overlapping the entire area of the driving integrated circuit 300 disposed therebelow.

The ultrasonic device 700 may vibrate the bump in a vibration direction while vibrating in the predetermined vibration direction. However, in this case, although the signal wire PAD may vibrate slightly in the vibration direction due to the vibration transmitted through the bump, a vibration amplitude thereof may be insignificant. Accordingly, the vibration amplitude of the vibration transmitting part 740 in the vibration direction may be regarded as substantially the same as a distance that the bump moves on the signal wire PAD in the vibration direction. In one embodiment, the vibration direction may be a second direction DR2. That is, the vibration direction may be a direction in which the signal wire PAD and a long side of the bump extend.

When the bump is ultrasonically vibrated on one surface of the signal wire PAD, a predetermined frictional force is generated at an interface between one surface of the signal wire PAD and one surface of the bump, and frictional heat may be generated due to the frictional force. When the frictional heat is sufficient to melt the materials of the signal wire PAD and the bump, a pad melting area PADb adjacent to the bump of the signal wire PAD and a bump melting area 370*b* adjacent to the signal wire PAD of the bump may be melted. That is, the signal wire PAD may include a pad non-melting area PADa and the pad melting area PADb. In addition, the bump may include a bump non-melting area 370*a* and the bump melting area 370*b*.

The pad non-melting area PADa may be an area including only the material included in the signal wire PAD. The bump non-melting area 370*a* may be an area including only the material included in the bump.

The pad melting area PADb may be an area in which the material included in the bump is diffused, and the material of the signal wire PAD and the material of the bump are mixed, and the bump melting area 370*b* may be an area in which the material in the signal wire PAD is diffused, and the material of the bump and the material of the signal wire PAD are mixed.

In the pad melting area PADb and the bump melting area 370*b*, the signal wire PAD and the bump may be bonded to each other through solidification. An interface between the signal wire PAD and the bump, e.g., an interface between the pad melting area PADb and the bump melting area 370*b*, may have a non-flat shape.

When bonding the signal wire PAD and the bump, as described above, the vibration transmitting part 740 of the ultrasonic device 700 presses an upper surface of the driving substrate 310 of the driving integrated circuit 300 in a third direction DR3 and applies the vibration along the second direction DR2, and accordingly, the bump disposed on the driving substrate 310 is bonded to the signal wire PAD as described above. After the ultrasonic bonding process, the vibration transmitting part 740 of the ultrasonic device 700 may be separated from the driving substrate 310 in the thickness direction DR3, and a bonding force between the signal wire PAD and the bump may be greater than a bonding force between the bump and the driving substrate 310, and thus delamination may occur between the bump and the driving substrate 310. As a result, a crack in the bump may be generated. The display device 1 according to one embodiment may prevent the delamination between the bump and the driving substrate 310 in advance by arranging a first curable pattern between adjacent bumps as will be described below.

A fourth conductive layer 150 may be disposed on the first via layer VIA1. The fourth conductive layer 150 may include a data line DL, a connection electrode CNE, and a high-potential voltage wire ELVDDL. The data line DL may be electrically connected to the source electrode SE of the thin-film transistor TFT through a contact hole passing through the first via layer VIA1. The connection electrode CNE may be electrically connected to the drain electrode DE of the thin-film transistor TFT through a contact hole passing through the first via layer VIA1. The high-potential voltage wire ELVDDL may be electrically connected to the high-potential voltage electrode ELVDDE through a contact hole passing through the first via layer VIA1. The fourth conductive layer 150 may include a material selected from the exemplified materials of the third conductive layer 140.

A second via layer VIA2 is disposed on the fourth conductive layer 150. The second via layer VIA2 may include at least one of the above-exemplified materials of the first via layer VIA1.

An anode AND is disposed on the second via layer VIA2. The anode AND may be electrically connected to the connection electrode CNE through a contact hole passing through the second via layer VIA2.

A bank layer BANK may be disposed on the anode AND. The bank layer BANK may include a contact hole that exposes the anode AND. The bank layer BANK may be made of an organic insulating material or an inorganic insulating material. For example, the bank layer BANK may include at least one of a photoresist, a polyimide-based resin, an acrylic-based resin, a silicon compound, a polyacrylic-based resin, and the like.

The organic layer EL may be disposed on an upper surface of the anode AND in an opening of the bank layer BANK. A cathode CAT is disposed on the organic layer EL and the bank layer BANK. The cathode CAT may be a common electrode disposed across a plurality of pixels.

A thin-film encapsulation layer 170 is disposed on the cathode CAT. The thin-film encapsulation layer 170 may cover an organic light-emitting diode (OLED). The thin-film encapsulation layer 170 may be a stacked film in which inorganic films and organic films are alternately stacked. For example, the thin-film encapsulation layer 170 may include a first encapsulation inorganic film 171, an encapsulation organic film 172, and a second encapsulation inorganic film 173, which are sequentially stacked.

Figure 4:
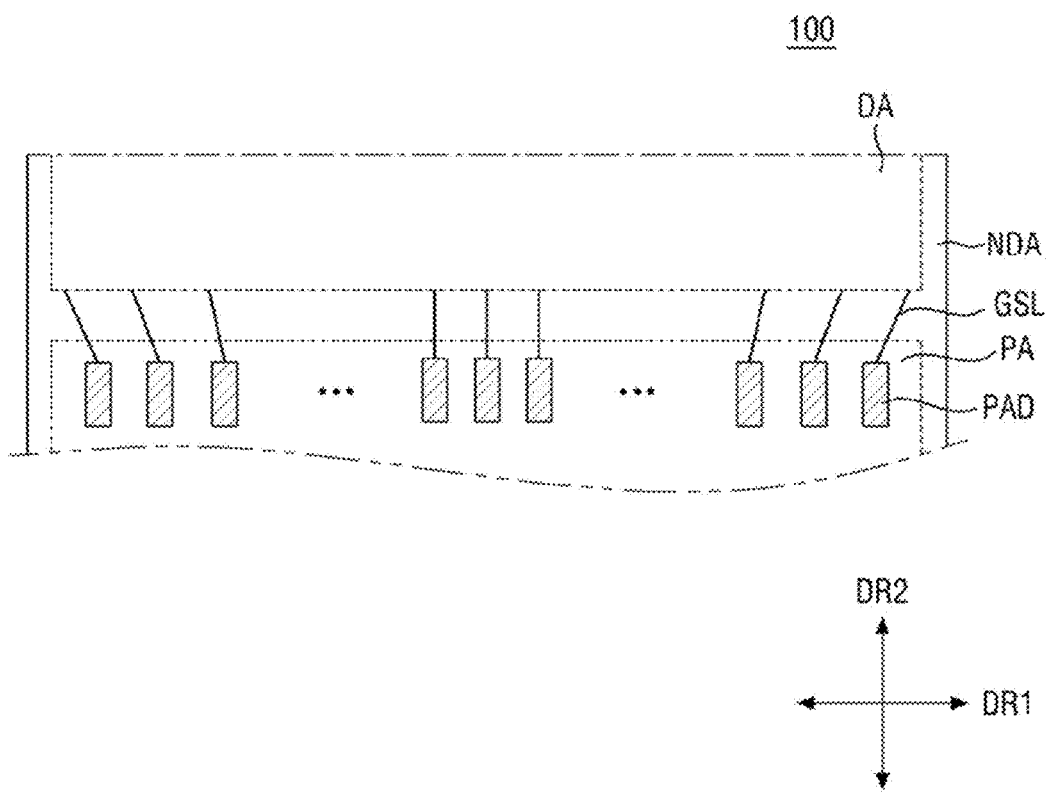
FIG. 4 is a plan layout view of the pad area of a display panel according to one embodiment.
Figure 7:
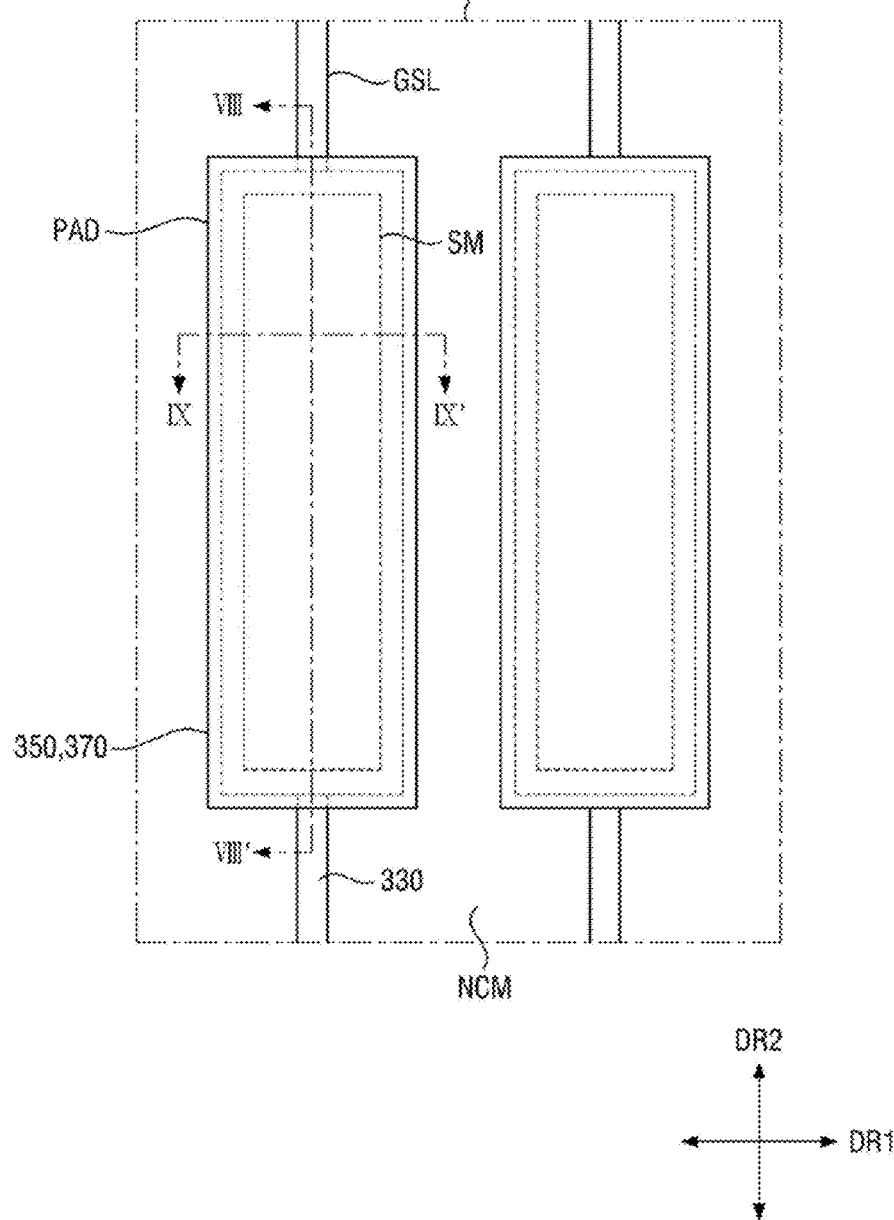
FIG. 7 is a partial enlarged view of FIG. 6.
Figure 8:
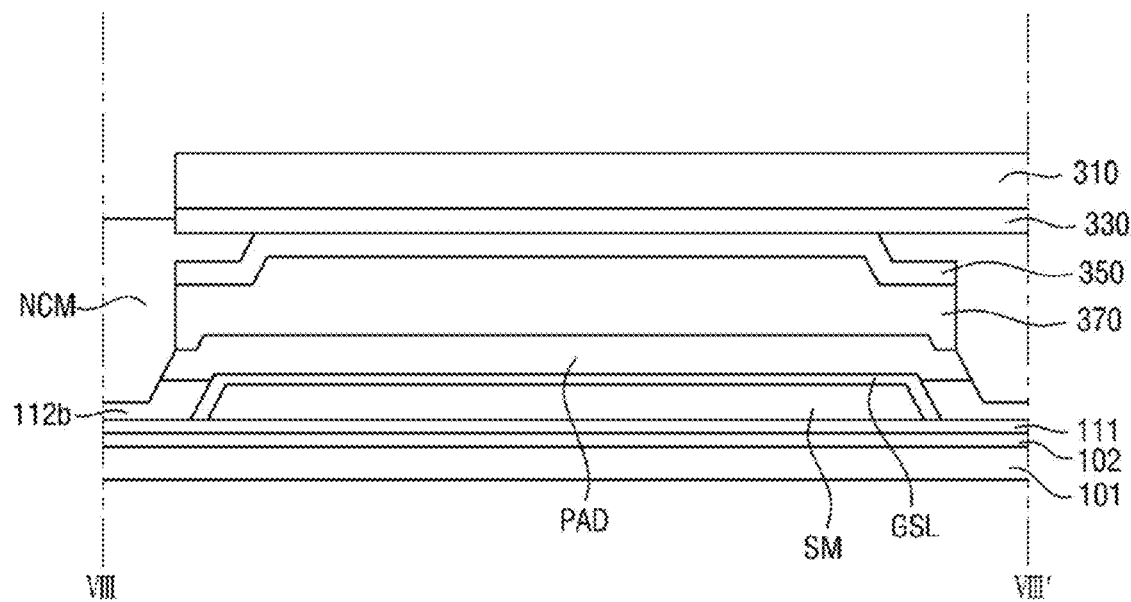
FIG. 8 is a cross-sectional view taken along line VIII-VIII' of FIG. 7.
Figure 9:
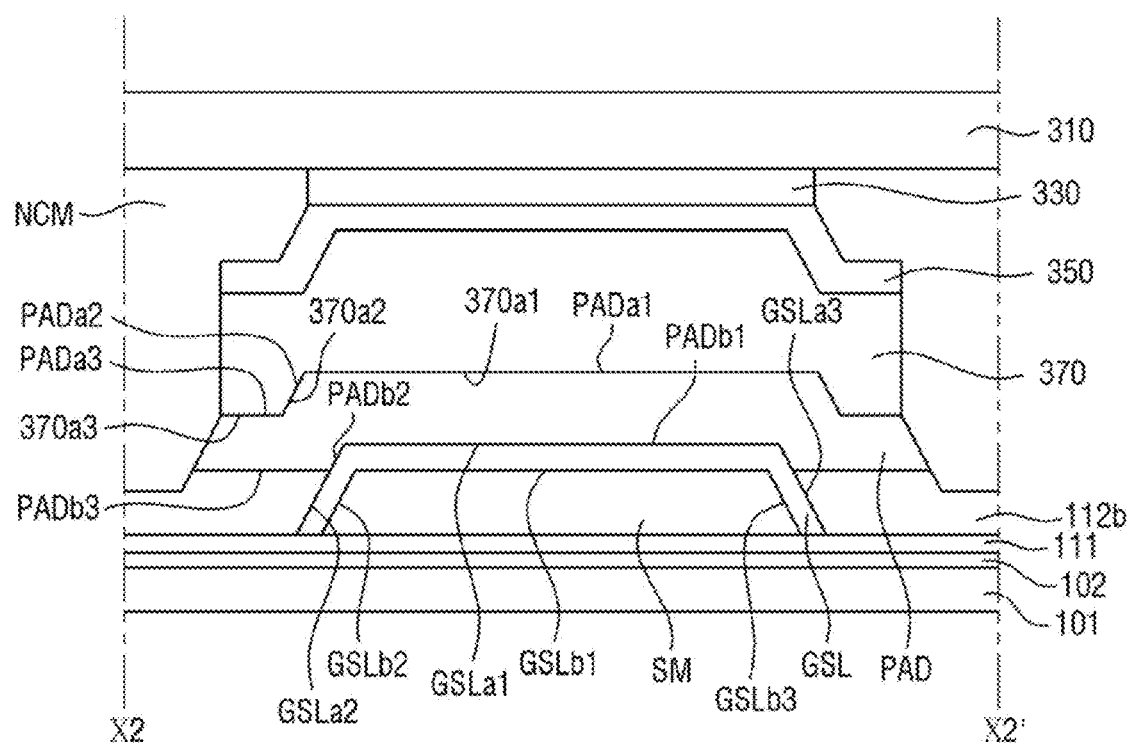
FIG. 9 is a cross-sectional view taken along line IX-IX' of FIG. 7.

FIG. 4 is a plan layout view of the pad area of the display panel according to one embodiment, FIG. 5 is a plan layout view of the driving integrated circuit according to one embodiment, FIG. 6 is a plan layout view of the pad area of the display panel to which the driving integrated circuit is attached, FIG. 7 is a partial enlarged view of FIG. 6, FIG. 8 is a cross-sectional view taken along line VIII-VIII' of FIG. 7, and FIG. 9 is a cross-sectional view taken along line IX-IX' of FIG. 7.

Referring to FIGS. 4 to 9, a plurality of signal wires PAD may be provided, and the plurality of signal wires PAD may be arranged along a first direction DR1. For example, the plurality of signal wires PAD may include a power pad, a data pad, and a panel dummy pad.

In addition, the bumps 350 and 370 of the driving integrated circuit 300 may include a plurality of bumps, and the plurality of bumps may be arranged along the first direction DR1.

A planar shape of each of the signal wire PAD and the bumps 350 and 370 may be a rectangular shape. That is, each of the signal wire PAD and the bumps 350 and 370 may include long sides extending along the second direction DR2 and short sides extending along the first direction DR1. A corner at which the long side and the short side meet may form a right angle. However, the planar shape of each of the signal wire PAD and the bumps 350 and 370 is not limited thereto, and of course, a square shape, a circular shape, an elliptical shape, other polygonal shape, or the like may be applied.

The planar size of the signal wire PAD and a planar size of each of the bumps 350 and 370 may be substantially the same, but are not limited thereto, and the planar size of the signal wire PAD may be greater than the planar size of each of the bumps 350 and 370, and vice versa.

Referring to FIG. 7, the connection wire GSL may be disposed to cross from the display area DA to the pad area PA, and may have a shape in which a width is increased in the first direction DR1 in an area overlapping the signal wire PAD of the pad area PA.

As described above, the planar size of the signal wire PAD may be greater than the planar size of each of the connection wire GSL and the supporter SM. The signal wire PAD may be disposed to overlap the connection wire GSL and the supporter SM in the thickness direction. The planar size of the supporter SM may be less than the planar size of the connection wire GSL. A planar shape of the supporter SM may be a rectangular shape, but is not limited thereto, and a square shape, a circular shape, an elliptical shape, other polygonal shape, or the like may be applied.

The driving wire 330 may be disposed to extend from an end portion of a lower side of the display panel 100 in the second direction DR2 in a plan view to the pad area PA. The driving wire 330 may have a shape in which a width extends in the first direction DR1 in an area overlapping the signal wire PAD and the bumps 350 and 370 in the thickness direction. A planar shape of the driving wire 330 may be a rectangular shape in an area overlapping the signal wire PAD and the bumps 350 and 370 in the thickness direction. That is, in the above-described area, the driving wire 330 may include short sides extending along the first direction DR1 and long sides extending along the second direction DR2, and a corner at which the long side and the short side meet may form a right angle. However, the planar shape of the driving wire 330 is not limited thereto, and the planar shape of the driving wire 330 may be a square shape, a circular shape, an elliptical shape, other polygonal shape, or the like.

A planar size of the driving wire 330 may be substantially the same as the planar size of the connection wire GSL described above. However, the planar size of the driving wire 330 is not limited thereto, and may be less or greater than the planar size of the connection wire GSL.

The bumps 350 and 370 may be disposed to overlap the signal wire PAD and the driving wire 330 in the thickness direction. The planar size of each of the bumps 350 and 370 may be substantially the same as the planar size of the signal wire PAD. The planar size of each of the bumps 350 and 370 may be greater than the planar size of the driving wire 330.

Referring to FIGS. 8 and 9, the supporter SM may be covered by the connection wire GSL disposed thereabove. As shown in FIG. 9, when the supporter SM has a trapezoidal shape, the supporter SM may include an upper surface, a lower surface, and side surfaces. The connection wire GSL may be disposed on the upper and side surfaces of the supporter SM.

The lower surface of the supporter SM may be in direct contact with the first insulating layer 111. The upper and side surfaces of the supporter SM may be covered by and in direct contact with the connection wire GSL. The connection wire GSL may be formed along the surface of the supporter SM along the shape of the supporter SM. An overall thickness of the connection wire GSL may be the same. That is, the thickness of a portion of the connection wire GSL disposed on the upper surface of the supporter SM and the thickness of a portion of the connection wire GSL disposed on the side surface of the supporter SM may be substantially the same.

A surface of the connection wire GSL may include an inner surface and an outer surface. The outer surface of the connection wire GSL may include an upper surface GSLa1 and outer side surfaces GSLa2 and GSLa3, and the inner surface of the connection wire GSL may include a lower surface GSLb1 and inner side surfaces GSLb2 and GSLb3. The lower surface GSLb1 of the connection wire GSL may be in direct contact with the upper surface of the supporter SM. The inner side surfaces GSLb2 and GSLb3 of the connection wire GSL may be in direct contact with the side surfaces of the supporter SM, respectively.

The second insulating layer 112b may be further disposed on the side surface of the connection wire GSL. The second insulating layer 112b may be contact with the supporter SM and the upper surface of the first insulating layer 111 exposed by the connection wire GSL. The second insulating layer 112b may be disposed on the outer side surfaces GSLa2 and GSLa3 of the connection wire GSL. The second insulating layer 112b may expose an upper end portion of each of the outer side surfaces GSLa2 and GSLa3 of the connection wire GSL and cover a lower end portion of each of the outer side surfaces GSLa2 and GSLa3. The second insulating layer 112b may be in direct contact with the lower end portion of each of the outer side surfaces GSLa2 and GSLa3 of the connection wire GSL.

The signal wire PAD may be disposed on the second insulating layer 112b and the connection wire GSL. The signal wire PAD may be disposed on the upper surface and the side surfaces of the connection wire GSL. An overall thickness of portions of the signal wire PAD may be the same. For example, the thickness of a portion of the signal wire PAD disposed on the upper surface of the connection wire GSL and the thickness of a portion of the signal wire PAD disposed on the side surfaces of the connection wire GSL may be substantially the same.

A surface of the signal wire PAD may include an inner surface and an outer surface. The inner surface of the signal wire PAD may include a first upper surface PADa1, a second upper surface PADa3, and an outer side surface PADa2 disposed between the first upper surface PADa1 and the second upper surface PADa3 and connecting the first upper surface PADa1 and the second upper surface PADa3, and the outer surface of the signal wire PAD may include a first lower surface PADb1, a second lower surface PADb3, and an inner side surface PADb2 disposed between the first lower surface PADb1 and the second lower surface PADb3 and connecting the first lower surface PADb1 and the second lower surface PADb3. The second upper surface PADa3 and the outer side surface PADa2 may be further located in opposite directions symmetrically with respect to the first upper surface PADa1. Similarly, the second lower surface PADb3 and the inner side surface PADb2 may be further located in opposite directions symmetrically with respect to the first lower surface PADb1.

The first lower surface PADb1 of the signal wire PAD may be located to protrude further upward than the second lower surface PADb3 in the thickness direction. In addition, the first upper surface PADa1 of the signal wire PAD may be located to protrude further upward than the second upper surface PADa3 in the thickness direction.

The first lower surface PADb1 of the signal wire PAD may be in direct contact with the upper surface GSLa1 of the connection wire GSL, the inner side surface PADb2 of the signal wire PAD may be in direct contact with the upper end portion of the outer side surface GSLa2 of the connection wire GSL exposed by the second insulating layer 112b, and the second lower surface PADb3 of the signal wire PAD may be in direct contact with the upper surface of the second insulating layer 112b.

The first upper surface PADa1, the second upper surface PADa3, and the outer side surface PADa2 of the signal wire PAD may be in contact with the bump. A surface of the second bump 370 may include an outer surface facing the signal wire PAD. The outer surface of the second bump 370 may include a first lower surface 370a1, a second lower surface 370a3, and an outer side surface 370a2 disposed between the first lower surface 370a1 and the second lower surface 370a3 and physically connecting the first lower surface 370a1 and the second lower surface 370a3. The second lower surface 370a3 and the outer side surface 370a2 may be further located in opposite directions symmetrically with respect to the first lower surface 370a1.

The first lower surface 370a1 of the second bump 370 may be located to be indented further upward than the second lower surface 370a3 in the thickness direction.

The first lower surface 370a1 of the second bump 370 may be in direct contact with the first upper surface PADa1 of the signal wire PAD, and the second lower surface 370a3 of the second bump 370 may be in direct contact with the second upper surface PADa3 of the signal wire PAD, and the outer side surface 370a2 of the second bump 370 may be in direct contact with the outer side surface PADa2 of the signal wire PAD. As described above, the first lower surface 370a1, the second lower surface 370a3, and the outer side surface 370a2 may be in direct contact with the first upper surface PADa1, the second upper surface PADa3, and the outer side surface PADa2, respectively. The first lower surface 370a1, the second lower surface 370a3, and the outer side surface 370a2 may be ultrasonically connected or ultrasonically bonded to the first upper surface PADa1, the second upper surface PADa3, and the outer side surface PADa2, respectively.

In the display device 1 according to one embodiment, the surface of the signal wire PAD may be in contact with the connection wire GSL therebelow and the second insulating layer 112b, and the supporter SM may be disposed between first insulating layer 111 and the connection wire GSL so that the surface of a central portion of the connection wire GSL may protrude in the thickness direction, and the surface of a central portion of the signal wire PAD disposed along the surface of the connection wire GSL may protrude in the thickness direction. The signal wire PAD having a shape in which the surface of the central portion protrudes in the thickness direction may be engaged with the shape of the second bump 370 of the driving integrated circuit 300. That is, the signal wire PAD may include a first portion (the central portion) having a first surface height and second portions (edge portions) disposed on one side and the other side of the first portion in the first direction DR1 and having a second surface height less than the first surface height, and the second bump 370 may include a first portion (the central portion) having a third surface height and second portions (edge portions) disposed on one side and the other side of the first portion in the first direction DR1 and having a fourth surface height less than the third surface height. The protruding first portion of the signal wire PAD may be coupled to the indented first portion of the second bump 370, and the indented second portion of the signal wire PAD may be coupled to the protruding second portion of the second bump 370. Accordingly, bonding reliability and a contact area between the signal wire PAD and the second bump 370 may be increased, and resistance between the second bump 370 and the signal wire PAD may be reduced.

Furthermore, by allowing the first portion (the central portion) of each of the signal wire PAD and the second bump 370 to be in direct contact with each other, there is no room for the non-conductive member NCM to remain in the first portion (the central portion), thereby preventing the occurrence of an open defect between the signal wire PAD and the second bump 370 caused by the non-conductive member NCM.

Hereinafter, a method of manufacturing the above-described display device will be described. In the following embodiments, components that are the same as those in the above-described embodiments will be referred to with the same reference numerals, and descriptions of the components will be omitted or simplified.

Figure 10:
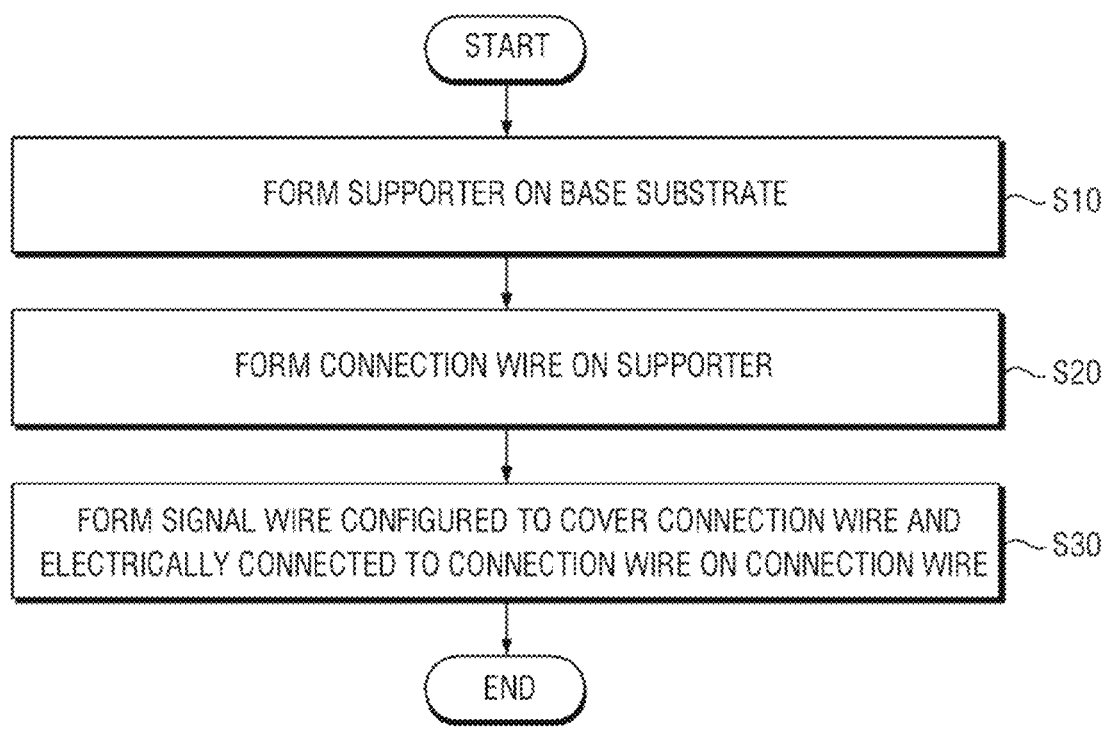
FIG. 10 is a flowchart of a method of manufacturing the display device according to one embodiment.
Figure 11:
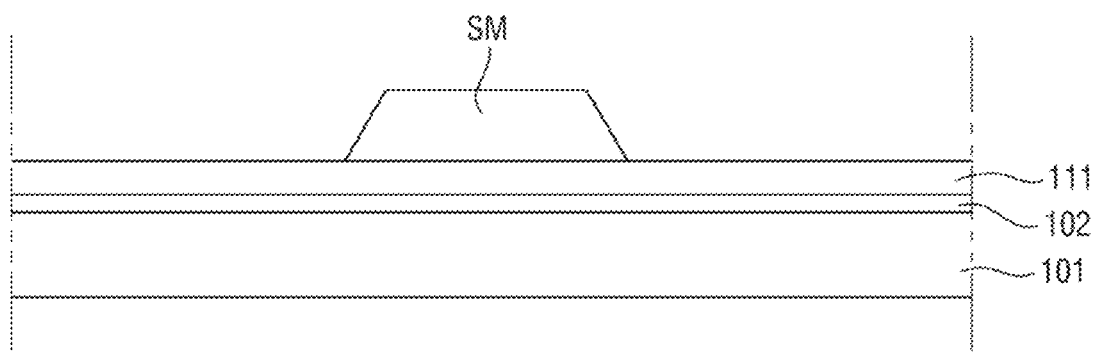
FIGS. 11 and 12 are cross-sectional views illustrating a processing operation of the method of manufacturing the display device according to one embodiment.
Figure 12:
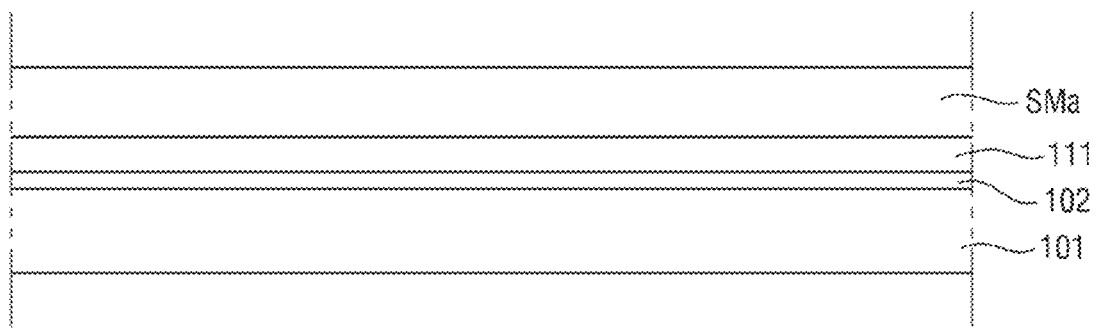
Figure 13:
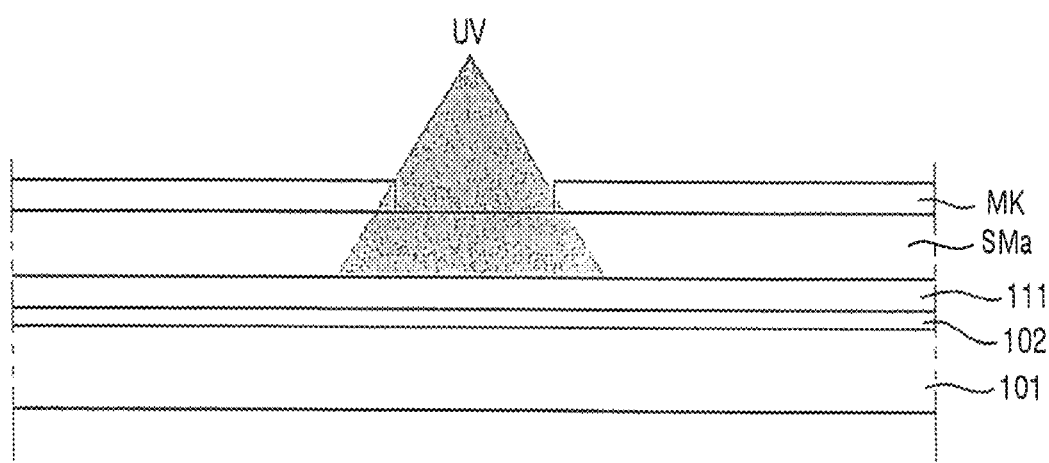
FIG. 13 is a cross-sectional view illustrating a processing operation of a method of manufacturing the display device according to an embodiment.
Figure 14:
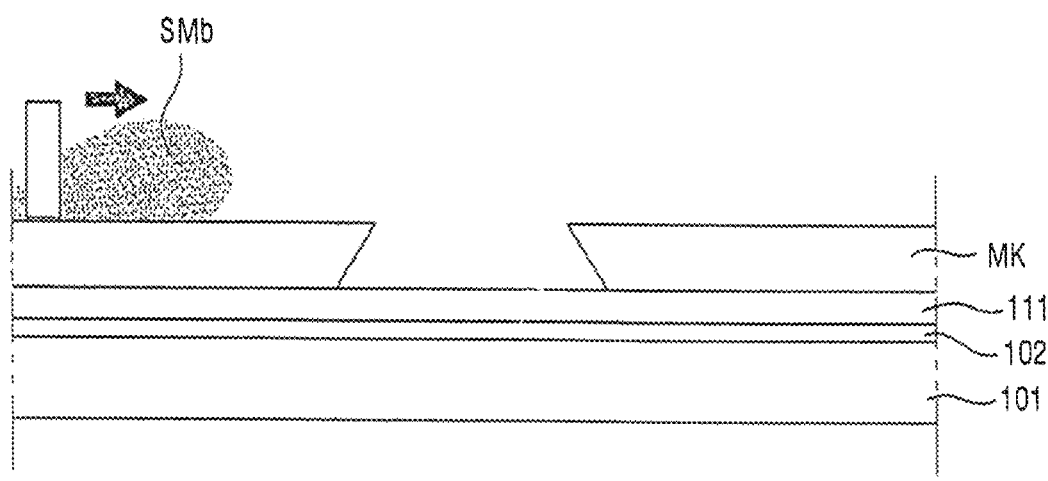
FIGS. 14 and 15 are cross-sectional views illustrating a processing operation of a method of manufacturing the display device according to an embodiment.
Figure 15:
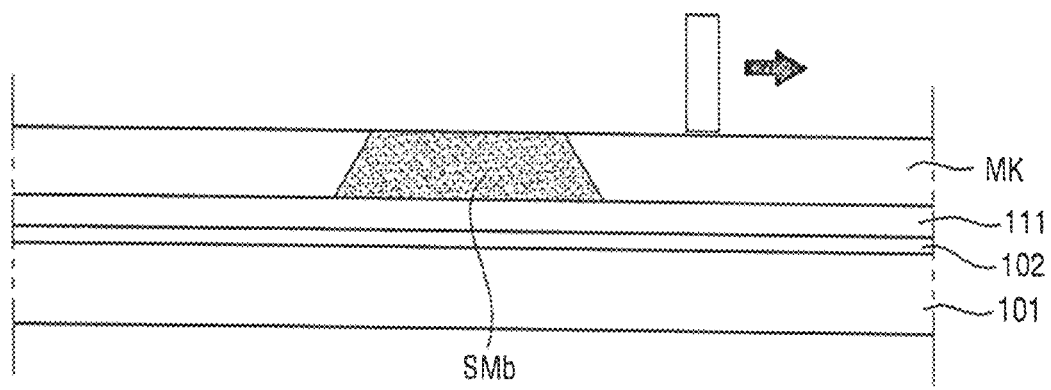
Figure 16:
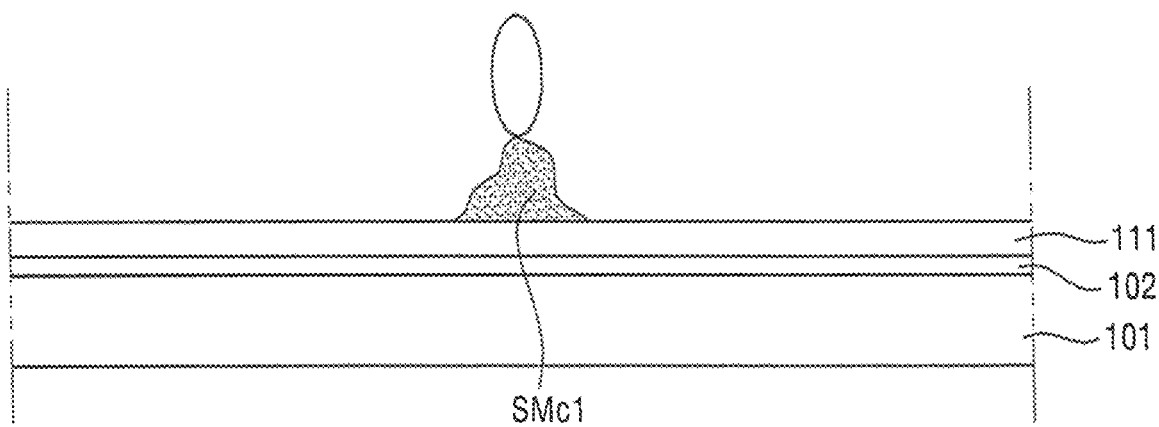
FIGS. 16 and 17 are cross-sectional views illustrating a processing operation of a method of manufacturing the display device according to an embodiment.
Figure 17:
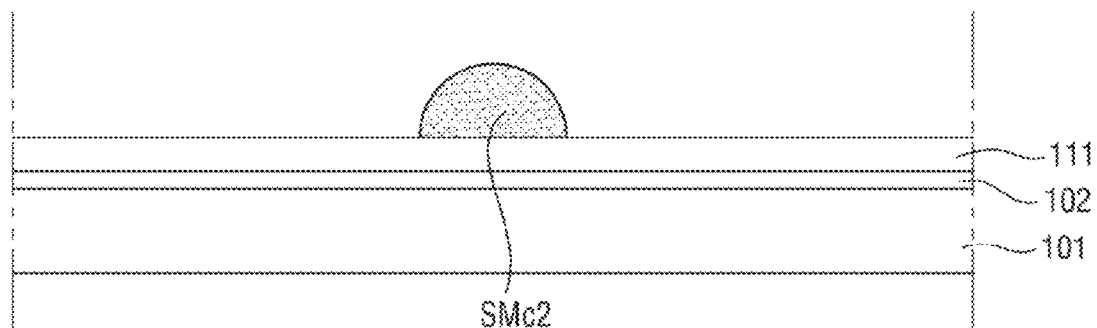
Figure 18:
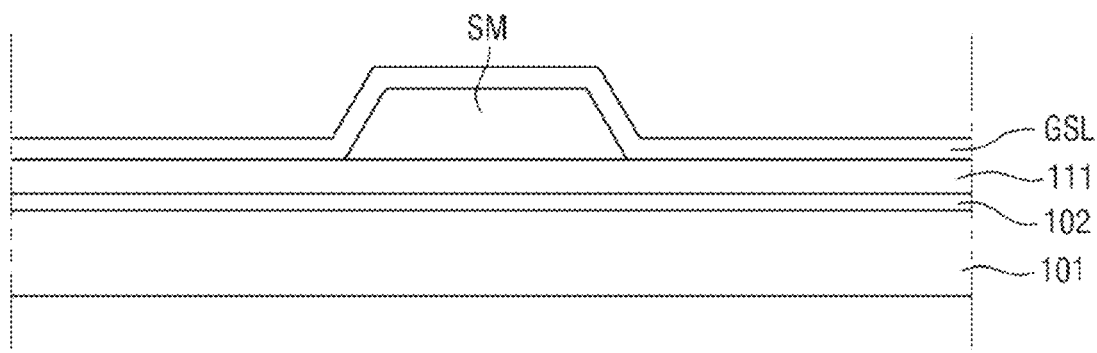
FIG. 18 is a cross-sectional view illustrating the processing operation of the method of manufacturing the display device according to one embodiment.

FIG. 10 is a flowchart of a method of manufacturing the display device according to one embodiment, FIGS. 11 and 12 are cross-sectional views illustrating a processing operation of the method of manufacturing the display device according to one embodiment, FIG. 13 is a cross-sectional view illustrating a processing operation of a method of manufacturing the display device according to an embodiment, FIGS. 14 and 15 are cross-sectional views illustrating a processing operation of a method of manufacturing the display device according to an embodiment, FIGS. 16 and 17 are cross-sectional views illustrating a processing operation of a method of manufacturing the display device according to an embodiment, and FIG. 18 is a cross-sectional view illustrating the processing operation of the method of manufacturing the display device according to one embodiment.

Referring to FIGS. 10 and 11, a supporter is formed on a display substrate 101 or a base substrate (S10).

A supporter SM may be disposed on a first insulating layer 111. The supporter SM may be directly disposed on an upper surface of the first insulating layer 111. The supporter SM may be disposed below the above-described connection wire GSL to protrude the connection wire GSL in the thickness direction. Due to the protruding connection wire GSL, a signal wire PAD may protrude together with the connection wire GSL in the thickness direction to facilitate bonding with bumps of a driving integrated circuit 300. The supporter SM may include an organic material or an inorganic material.

A cross-sectional shape of the supporter SM may be a trapezoidal shape.

FIGS. 12 to 17 illustrate various methods of forming the supporter SM.

Referring to FIGS. 12 and 13, the operation of forming the supporter on the display substrate 101 or the base substrate (S10) may further include an operation of forming the supporter SM through a photolithography process.

The operation of forming the supporter SM through the photolithography process may further include operations of applying a supporter material SMa on the first insulating layer 111, irradiating the supporter material SMa applied on the first insulating layer 111 with an ultraviolet (UV) laser, and developing the supporter material SMa irradiated with the ultraviolet laser to form the supporter SM. The operation of irradiating the supporter material SMa applied on the first insulating layer 111 with the ultraviolet (UV) laser may further include operations of disposing a mask MASK illustrated in FIG. 13 in an area except for the area where the supporter SM is formed, and irradiating the supporter material with the ultraviolet laser.

Referring to FIGS. 14 and 15, the operation of forming the supporter on the display substrate 101 or the base substrate (S10) may further include an operation of forming a supporter SM through a squeezing process.

The operation of forming the supporter SM through the squeezing process may further include operations of disposing a masking pattern MK on a first insulating layer 111 in an area except for a supporter disposing area, filling a supporter material SMb on the first insulating layer 111 exposed by the masking pattern MK by pushing the supporter material SMb through a squeezing device, and removing the masking pattern MK from the first insulating layer 111 and curing the supporter material SMb formed on an upper surface of the first insulating layer 111.

Referring to FIGS. 16 and 17, the operation of forming the supporter on the display substrate 101 or the base substrate (S10) may further include an operation of forming a supporter SM through an inkjet process.

The operation of forming the supporter SM through the inkjet process may include operations of applying a supporter material SMc1 onto a first insulating layer 111 through an inkjet device, and curing the supporter material SMc1 applied onto the first insulating layer 111 to form the supporter SM.

Subsequently, referring to FIG. 18, the connection wire GSL is formed on the supporter SM (S20). The connection wire GSL may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The connection wire GSL may be a single film or a stacked film made of the above-exemplified materials.

The connection wire GSL may be formed to cover a surface of the supporter SM and to be in direct contact with the surface of the supporter SM. A portion of the connection wire GSL overlapping the supporter SM in the thickness direction may protrude in the thickness direction.

Thereafter, the signal wire PAD configured to cover the connection wire GSL and electrically connected to the connection wire GSL is formed on the connection wire GSL (S30).

Figure 19:
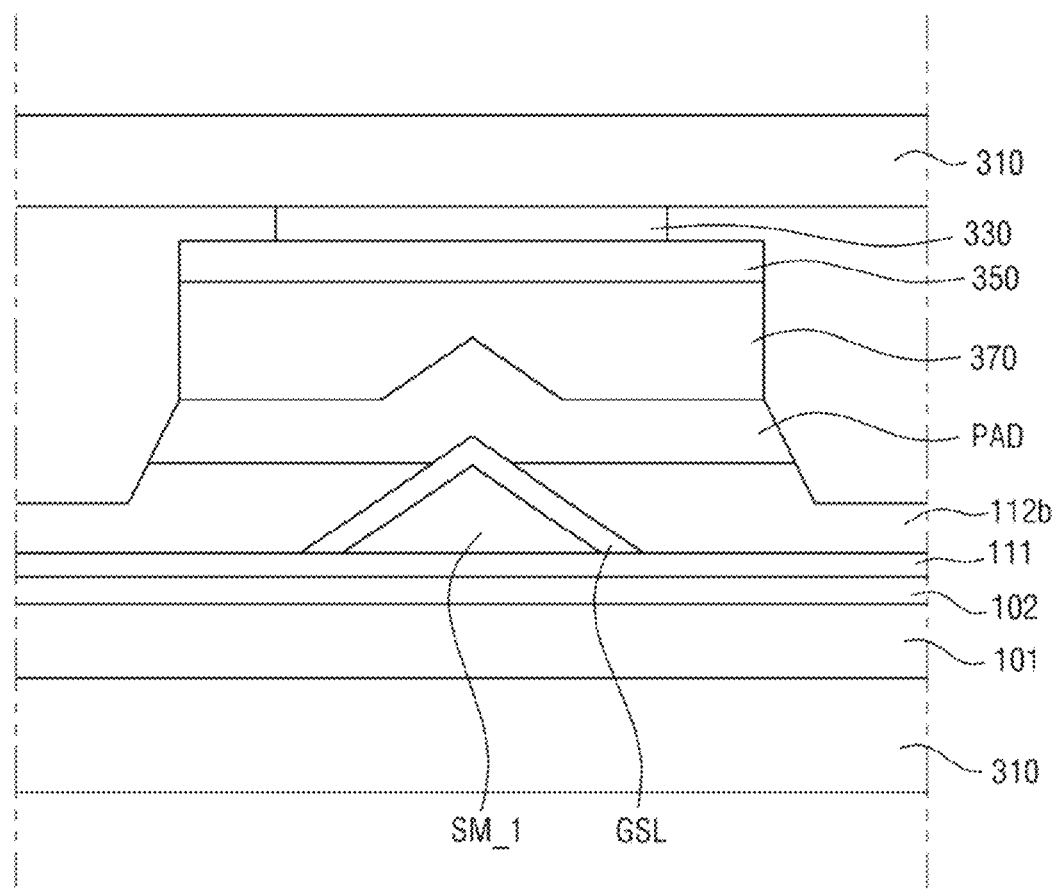
FIG. 19 is a cross-sectional view of a pad area of a display device according to an embodiment.
Figure 20:
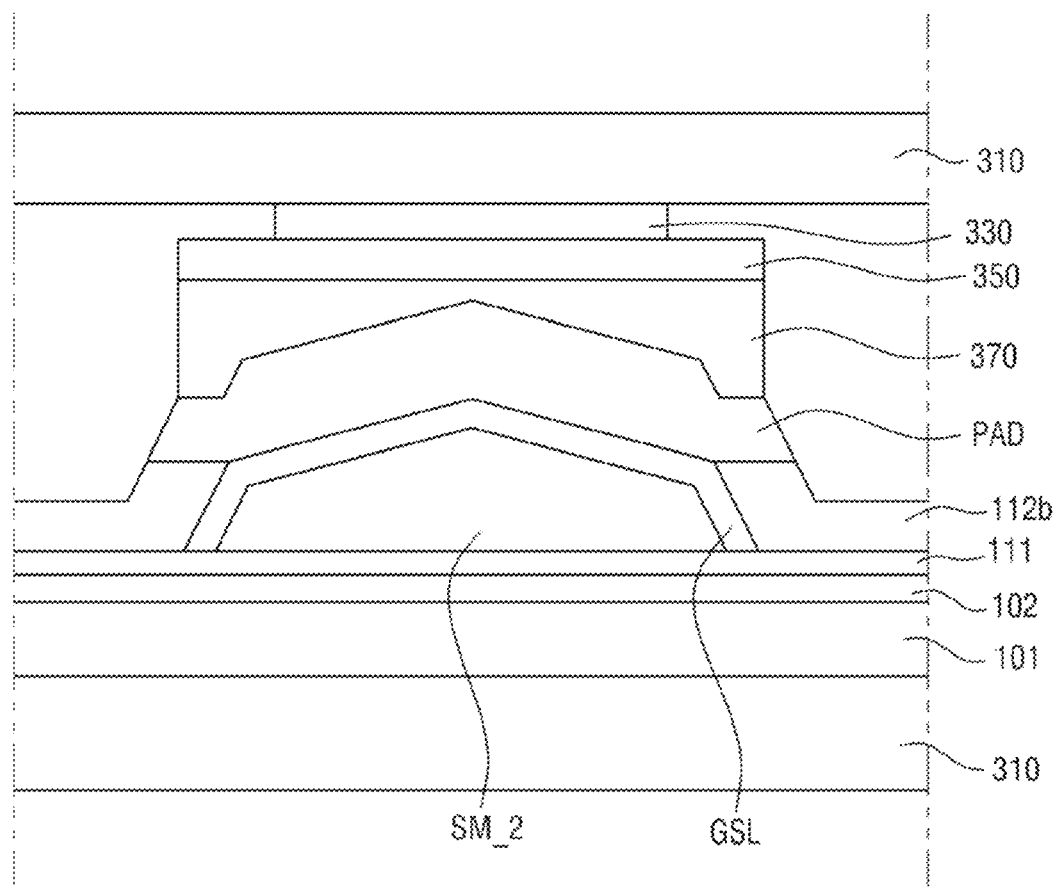
FIG. 20 is a cross-sectional view of a pad area of a display device according to an embodiment.
Figure 21:
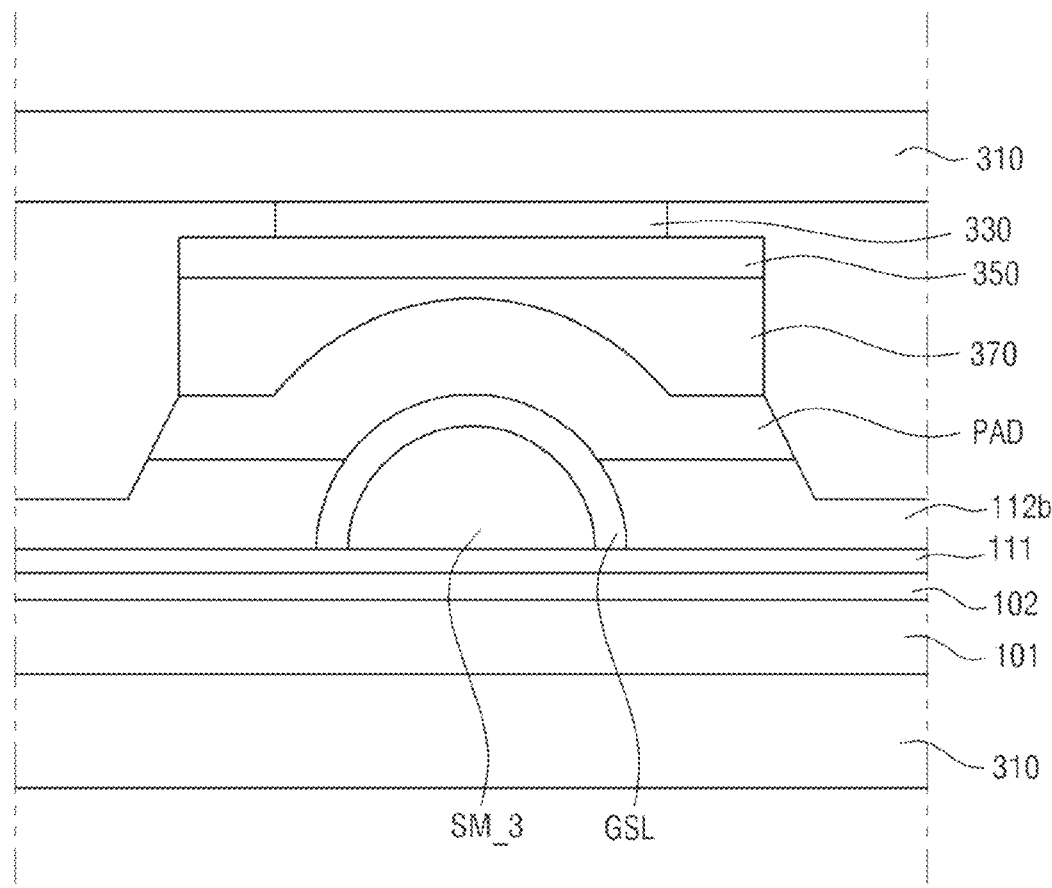
FIG. 21 is a cross-sectional view of a pad area of a display device according to an embodiment.
Figure 22:
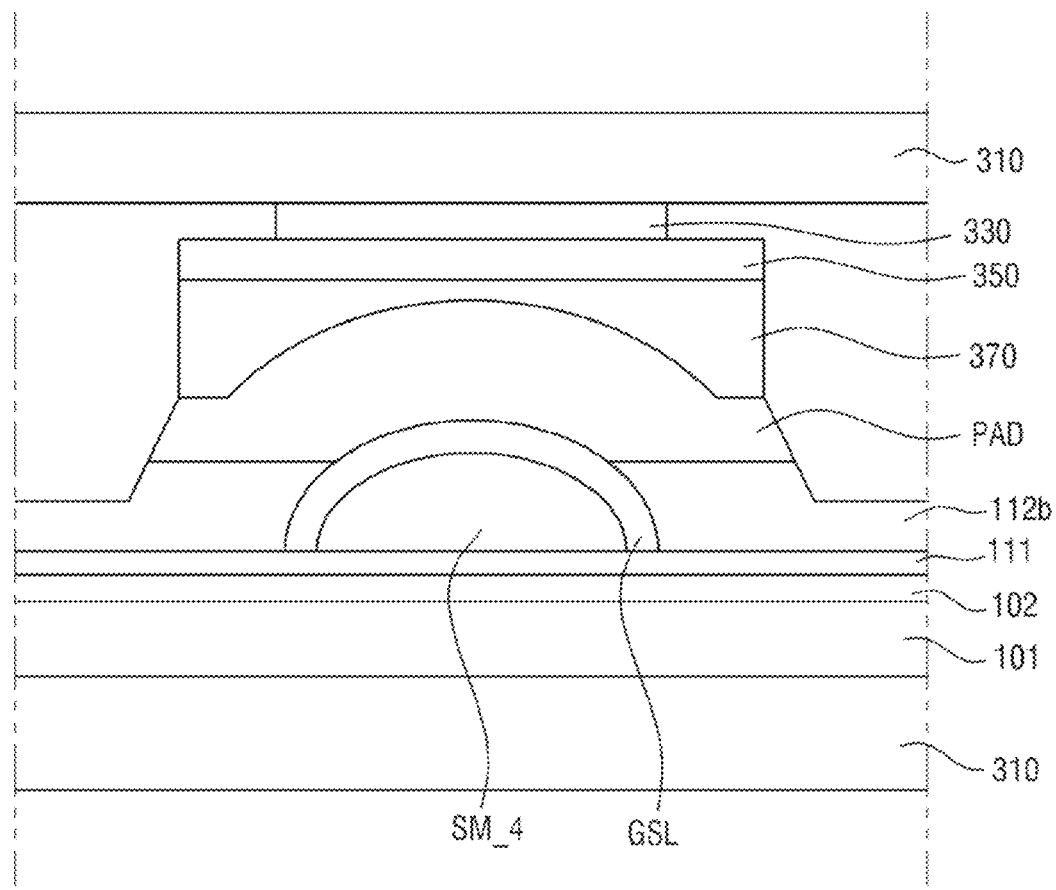
FIG. 22 is a cross-sectional view of a pad area of a display device according to an embodiment.
Figure 23:
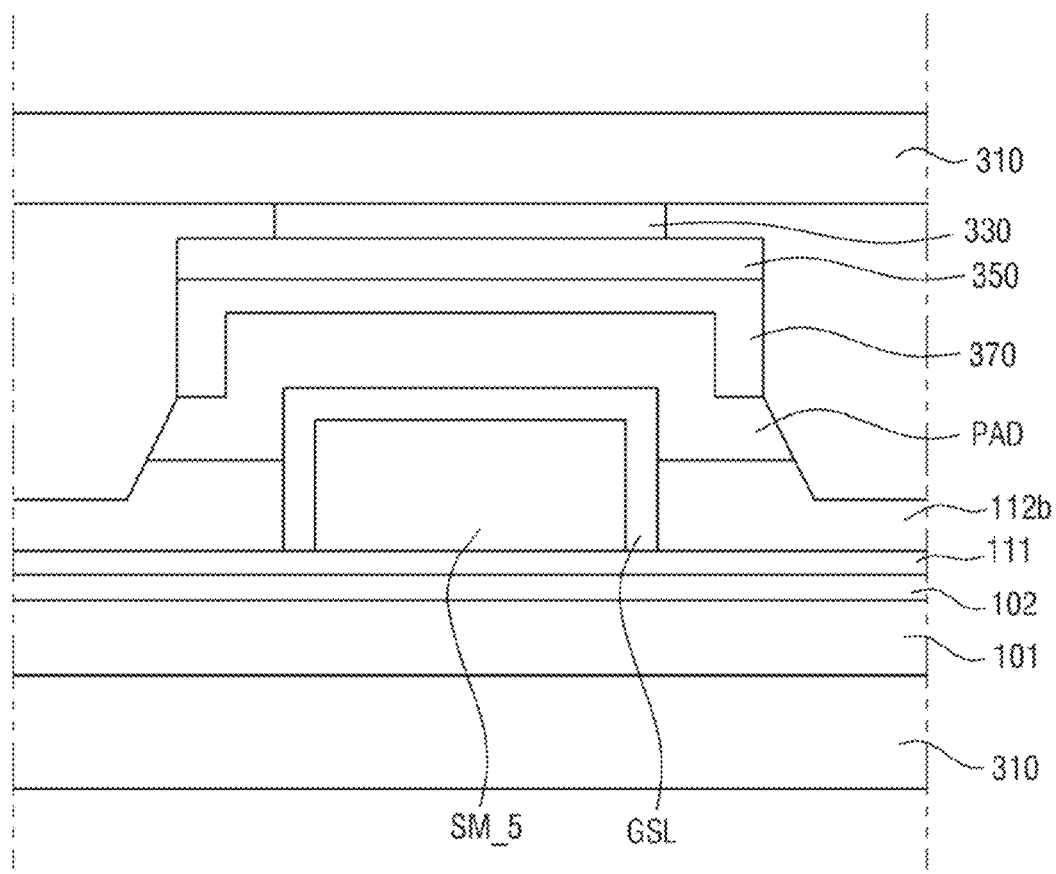
FIG. 23 is a cross-sectional view of a pad area of a display device according to an embodiment.

FIG. 19 is a cross-sectional view of a pad area of a display device according to an embodiment, FIG. 20 is a cross-sectional view of a pad area of a display device according to an embodiment, FIG. 21 is a cross-sectional view of a pad area of a display device according to an embodiment, FIG. 22 is a cross-sectional view of a pad area of a display device according to an embodiment, and FIG. 23 is a cross-sectional view of a pad area of a display device according to an embodiment.

FIGS. 19 to 23 illustrate various cross-sectional shapes of the supporter SM.

Referring to FIG. 19, it is exemplified that a cross-sectional shape of a supporter SM_1 may be applied in a triangular shape.

Other descriptions overlap with those described above with reference to FIG. 9 and thus will be omitted.

Referring to FIG. 20, it is exemplified that a cross-sectional shape of a supporter SM_2 may be applied in a pentagonal shape.

Other descriptions overlap with those described above with reference to FIG. 9 and thus will be omitted.

Referring to FIG. 21, it is exemplified that a cross-sectional shape of a supporter SM_3 may be applied in a semicircular shape.

Other descriptions overlap with those described above with reference to FIG. 9 and thus will be omitted.

Referring to FIG. 22, it is exemplified that a cross-sectional shape of a supporter SM_4 may be applied in a semi-elliptical shape.

Other descriptions overlap with those described above with reference to FIG. 9 and thus will be omitted.

Referring to FIG. 23, it is exemplified that a cross-sectional shape of a supporter SM_5 may be applied in a quadrangular shape.

Other descriptions overlap with those described above with reference to FIG. 9 and thus will be omitted.

Figure 24:
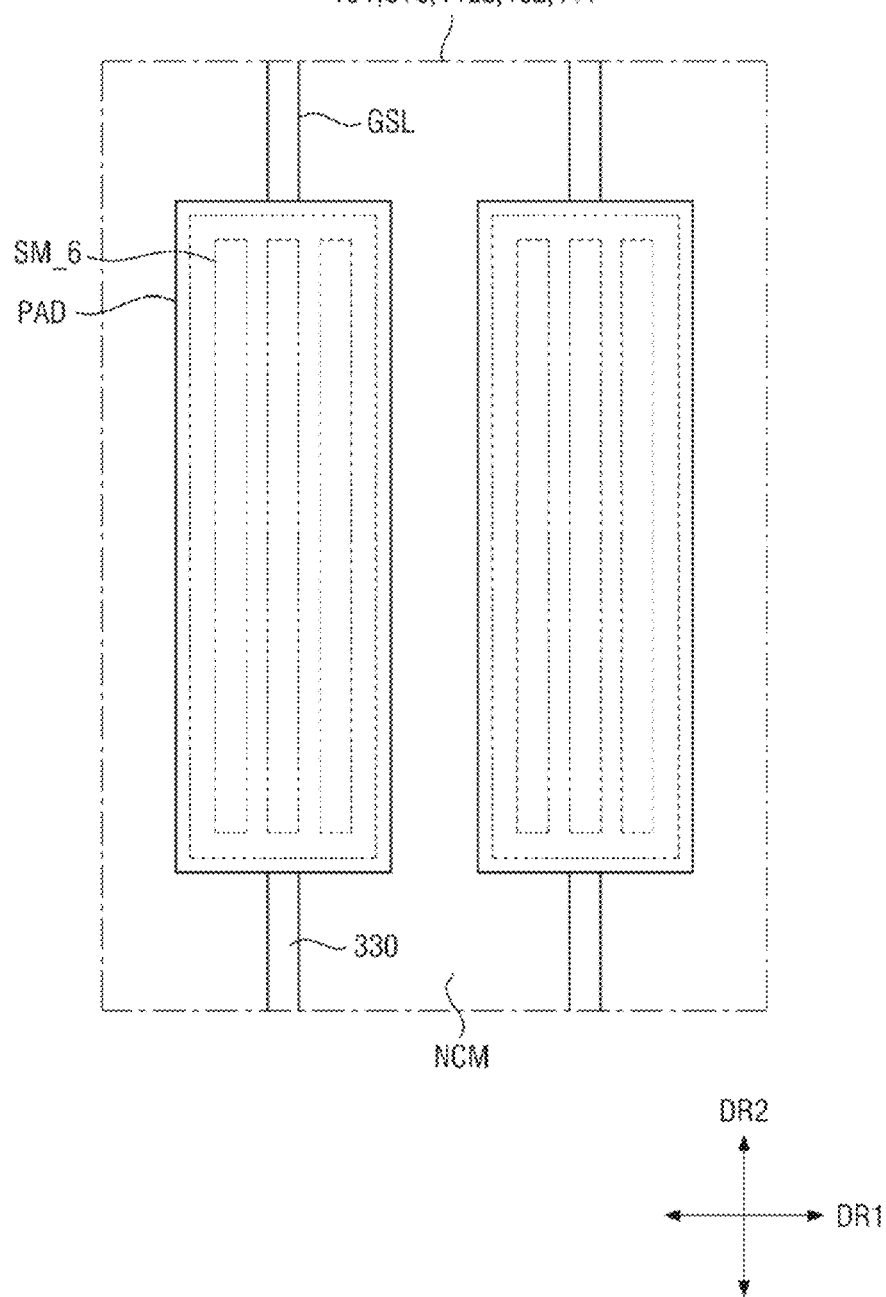
FIG. 24 is a plan layout view of a pad area of a display panel to which a driving integrated circuit according to an embodiment is attached.

FIG. 24 is a plan layout view of a pad area of a display panel to which a driving integrated circuit according to an embodiment is attached.

Referring to FIG. 24, a supporter SM_6 according to the present embodiment is different from the supporter SM of FIG. 7 in that the supporter SM_6 may have a line shape extending along a long-side direction of a signal wire PAD, and the supporter SM_6 having a line shape may include a plurality of patterns.

More specifically, the supporter SM_6 according to the present embodiment may have a line shape extending along the long-side direction or a column direction of the signal wire PAD, and the supporter SM_6 having a line shape may include the plurality of patterns.

The plurality of line-shaped patterns may be disposed to be spaced apart from each other along a short-side direction of the signal wire PAD. In FIG. 24, the number of line-shaped patterns is three, but is not limited thereto, and may be two or four or more.

Other descriptions overlap with those described above with reference to FIG. 7 and thus will be omitted.

Figure 25:
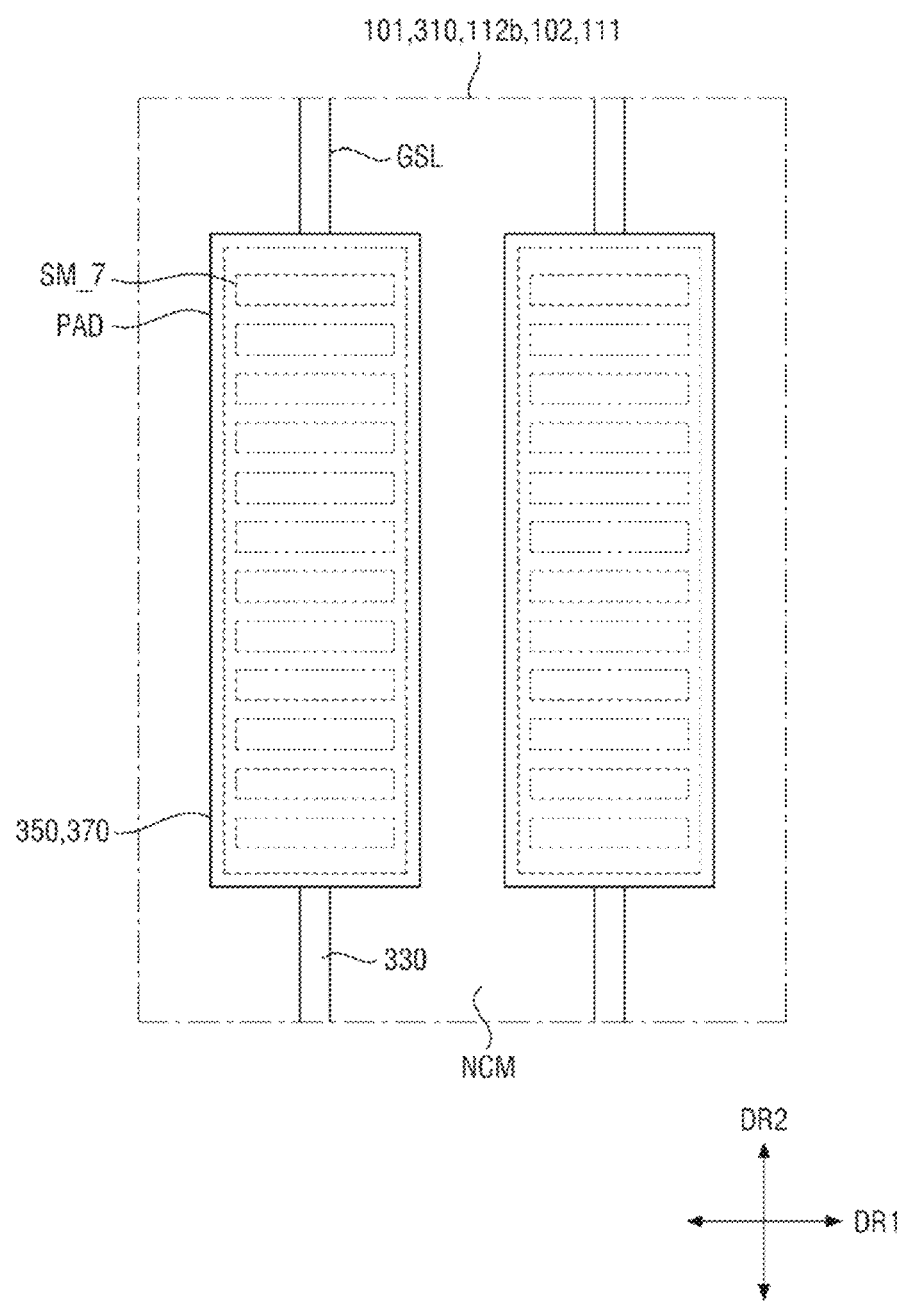
FIG. 25 is a plan layout view of a pad area of a display panel to which a driving integrated circuit according to an embodiment is attached.

FIG. 25 is a plan layout view of a pad area of a display panel to which a driving integrated circuit according to an embodiment is attached.

Referring to FIG. 25, a supporter SM_7 according to the present embodiment is different from the supporter SM of FIG. 7 in that the supporter SM_7 may have a line shape extending along a short-side direction or a row direction of a signal wire PAD, and the supporter SM_7 having a line shape may include a plurality of patterns.

More specifically, the supporter SM_7 according to the present embodiment may have a line shape extending along the short-side direction of the signal wire PAD, and the supporter SM_7 having a line shape may include the plurality of patterns.

The plurality of line-shaped patterns may be disposed to be spaced apart from each other along a long-side direction of the signal wire PAD. In FIG. 25, the number of line-shaped patterns is twelve, but is not limited thereto, and may be two to eleven or thirteen or more.

Other descriptions overlap with those described above with reference to FIG. 7 and thus will be omitted.

Figure 26:
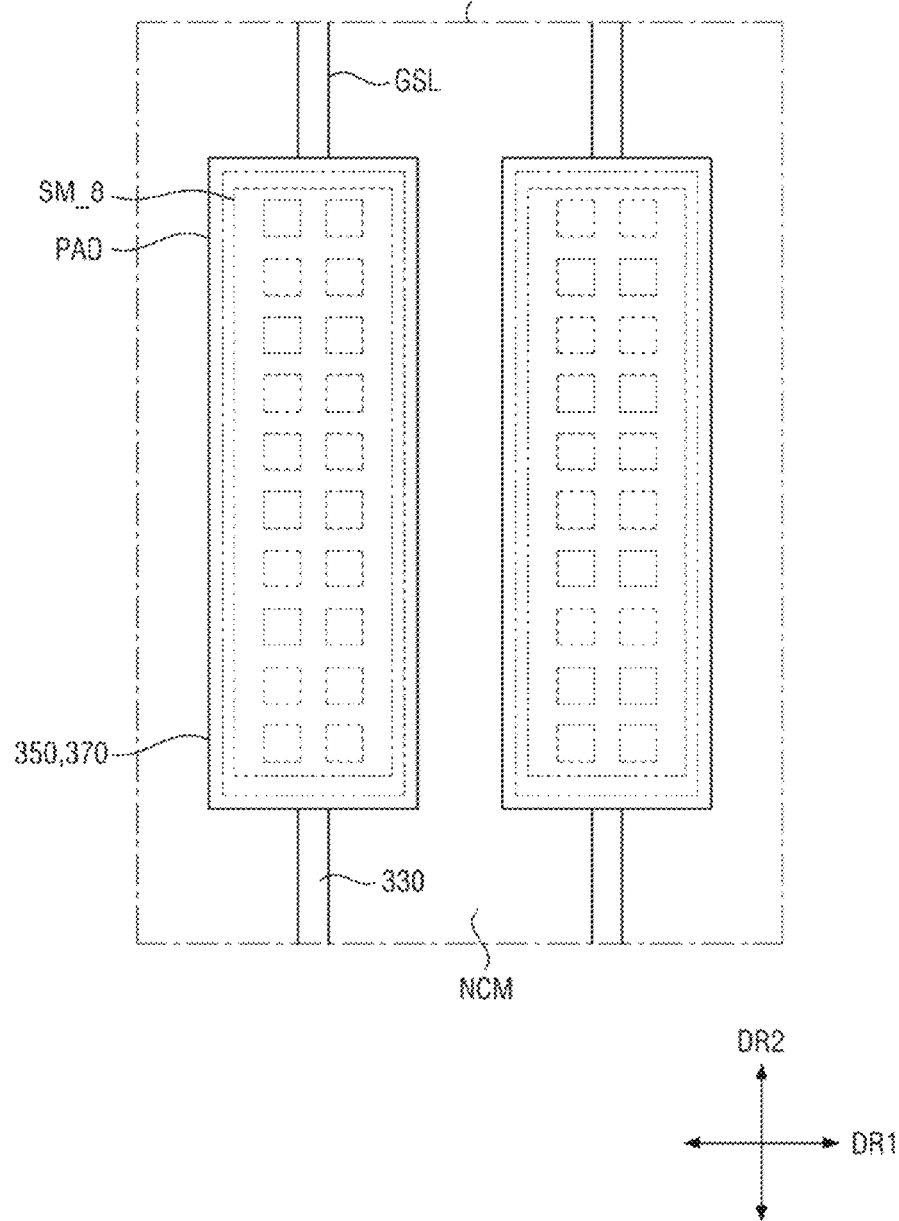
FIG. 26 is a plan layout view of a pad area of a display panel to which a driving integrated circuit according to an embodiment is attached.

FIG. 26 is a plan layout view of a pad area of a display panel to which a driving integrated circuit according to an embodiment is attached.

Referring to FIG. 26, a supporter SM_8 according to the present embodiment is different from the supporter SM of FIG. 7 in that the supporter SM_8 has a lattice shape extending along a long-side direction and a short-side direction of a signal wire PAD.

More specifically, the supporter SM_8 according to the present embodiment may have a lattice shape extending along the long-side direction and the short-side direction of the signal wire PAD.

Other descriptions overlap with those described above with reference to FIG. 7 and thus will be omitted.

Figure 27:
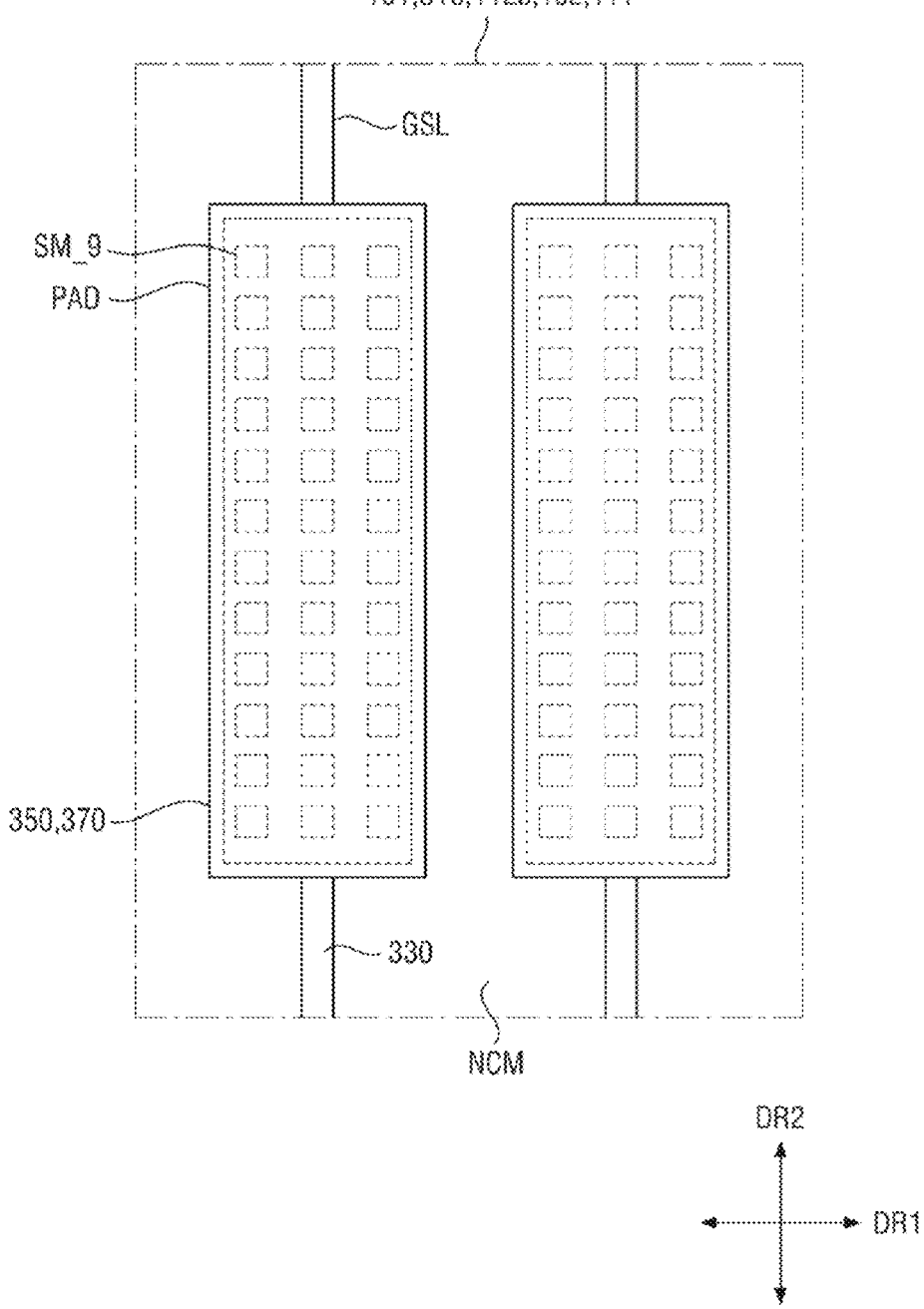
FIG. 27 is a plan layout view of a pad area of a display panel to which a driving integrated circuit according to an embodiment is attached.

FIG. 27 is a plan layout view of a pad area of a display panel to which a driving integrated circuit according to yet another embodiment is attached.

Referring to FIG. 27, a supporter SM_9 according to the present embodiment is different from the supporter SM of FIG. 7 in that the supporter SM_9 includes a plurality of patterns having an island shape.

More specifically, the supporter SM_9 according to the present embodiment may include the plurality of patterns having an island shape.

The plurality of island-shaped patterns may be arranged along a long-side direction and a short-side direction of the signal wire PAD, and the plurality of adjacent patterns may be disposed to be spaced apart from each other. In FIG. 27, the plurality of patterns are exemplified as being arranged in three columns along the long-side direction of the signal wire PAD and in twelve rows along the short-side direction of the signal wire PAD, but the present invention is not limited thereto.

As a cross-sectional shape of the island-shaped pattern, the trapezoidal shape of FIG. 9 may be applied, and a hexahedral shape having a trapezoidal cross-sectional shape may be applied.

Figure 28:
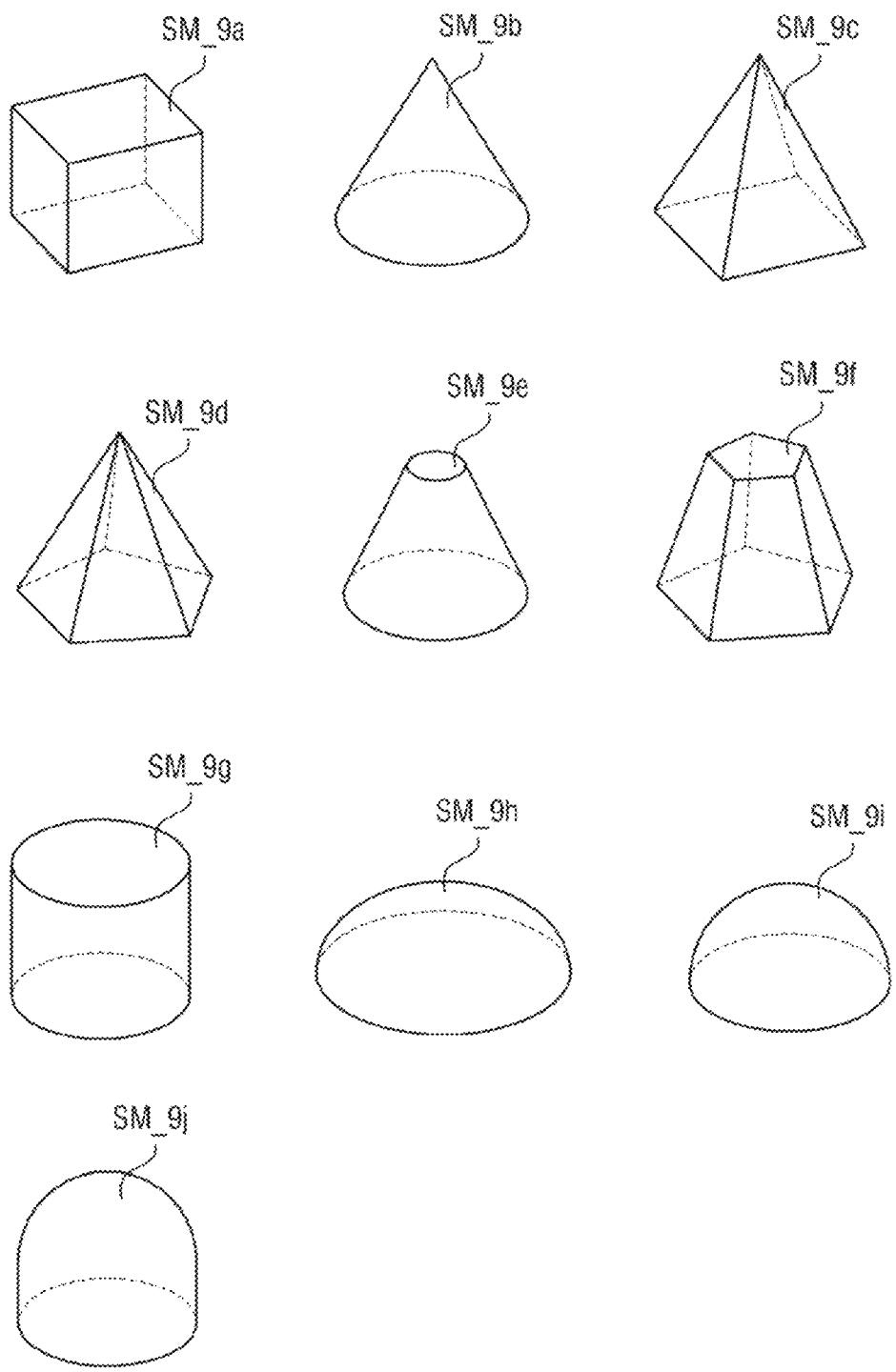
FIG. 28 is a view illustrating modified examples of a supporter according to one embodiment.

FIG. 28 is a view illustrating modified examples of the supporter according to one embodiment.

As shown in FIG. 28, a supporter SM_9a according to the present embodiment may be applied as a rectangular parallelepiped with a quadrangular-shaped cross section.

As shown in FIG. 28, a supporter SM_9b according to the present embodiment may be applied in a conical shape having a triangular-shaped cross section.

As shown in FIG. 28, a supporter SM_9c according to the present embodiment may be applied in a quadrangular pyramid shape having a quadrangular-shaped base surface and triangular-shaped side surfaces.

As shown in FIG. 28, a supporter SM_9d according to the present embodiment may be applied in a pentagonal pyramid shape having a pentagonal-shaped base surface and triangular-shaped side surfaces.

As shown in FIG. 28, a supporter SM_9e according to the present embodiment may be applied in a truncated conical shape having circular-shaped base and top surfaces, wherein an area of the base surface is greater than an area of the top surface.

As shown in FIG. 28, a supporter SM_9f according to the present embodiment may be applied in a pentagonal conical shape having pentagonal-shaped base and top surfaces, wherein an area of the base surface is greater than an area of the top surface.

As shown in FIG. 28, a supporter SM_9g according to the present embodiment may be applied in a cylindrical shape having circular-shaped base and top surfaces, wherein an area of the base surface is equal to an area of the top surface.

As shown in FIG. 28, a supporter SM_9h according to the present embodiment may be applied in a dish shape.

As shown in FIG. 28, a supporter SM_9i according to the present embodiment may be applied in a hemispherical shape.

As shown in FIG. 28, a supporter SM_9j according to the present embodiment may be applied in a bell shape.

Figure 30:
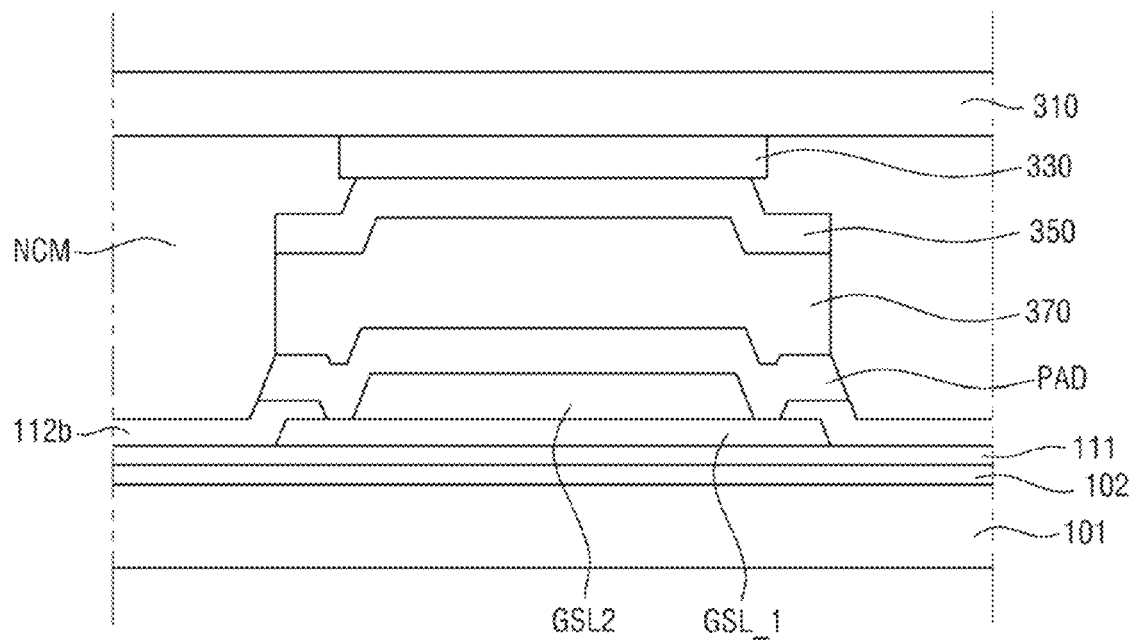
FIG. 30 is a cross-sectional view of the pad area of the display device according to an embodiment.

FIG. 29 is a plan layout view of a pad area of a display panel to which a driving integrated circuit according to an embodiment is attached, and FIG. 30 is a cross-sectional view of the pad area of the display device according to an embodiment.

Referring to FIGS. 29 and 30, the present embodiment is different from the embodiment according to FIGS. 7 and 9 in that a second connection wire GSL2 is further disposed between a connection wire GSL_1 and a signal wire PAD, and a supporter SM is omitted.

More specifically, a planar size of the second connection wire GSL2 may be less than a planar size of the connection wire GSL_1 and the planar size of the signal wire PAD. A planar shape of the second connection wire GSL2 may be a rectangular shape, but the present invention is not limited thereto.

The second connection wire GSL2 may be disposed directly on an upper surface of the connection wire GSL_1. The signal wire PAD may be directly disposed on and in direct contact with a second insulating layer 112b, the second connection wire GSL2, and the upper surface of the connection wire GSL_1 exposed by the second connection wire GSL2 and the second insulating layer 112b.

The second connection wire GSL2 may be disposed on the same layer as the second conductive layer 130 described above with reference to FIG. 3. The second connection wire GSL2 may include at least one of the exemplified materials of the second conductive layer 130.

Figure 31:
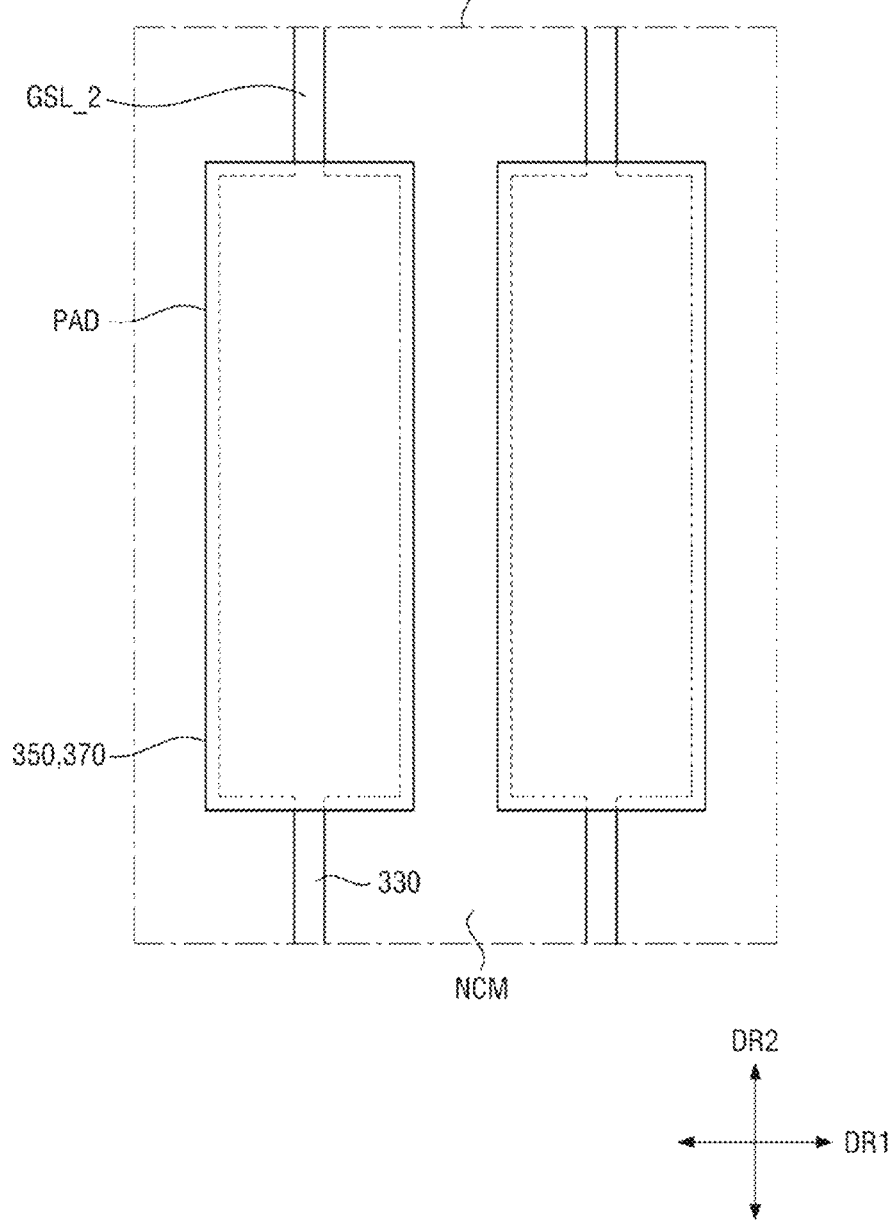
FIG. 31 is a plan layout view of a pad area of a display panel to which a driving integrated circuit according to an embodiment is attached.
Figure 32:
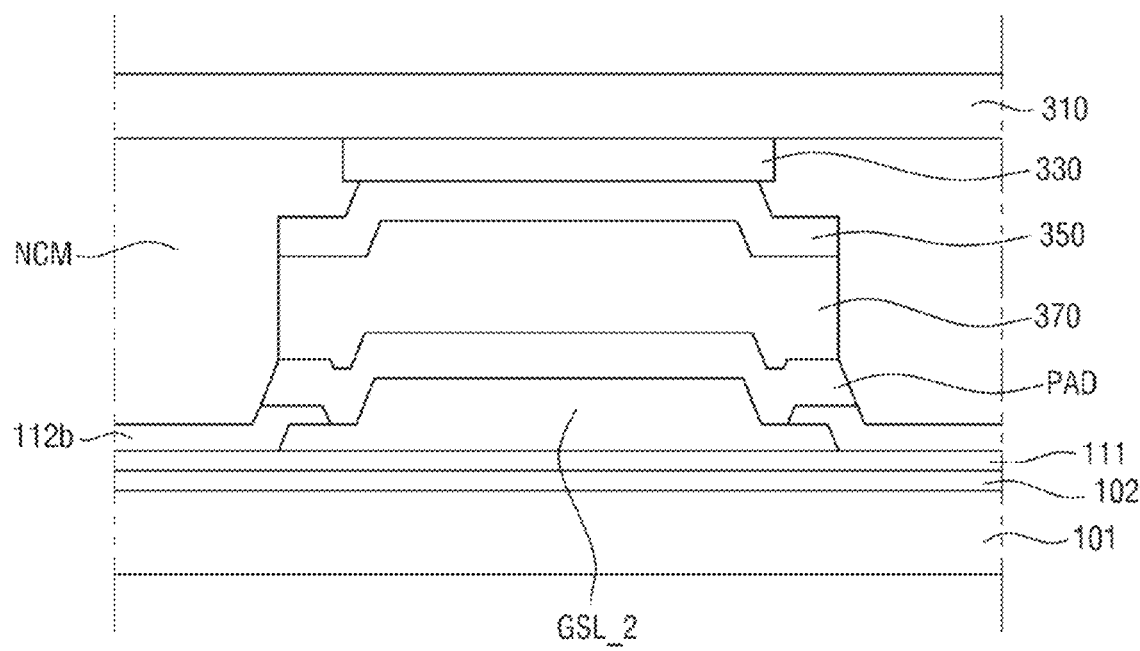
FIG. 32 is a cross-sectional view of the pad area of the display device according to an embodiment.

FIG. 31 is a plan layout view of a pad area of a display panel to which a driving integrated circuit according to an embodiment is attached, and FIG. 32 is a cross-sectional view of the pad area of the display device according to an embodiment.

Referring to FIGS. 31 and 32, the present embodiment is different from the embodiment according to FIGS. 7 and 9 in that a supporter SM is omitted and a connection wire GSL_2 includes portions having different thicknesses.

The connection wire GSL_2 may include a first portion or a central portion having a first thickness, and a second portion and a third portion having a second thickness less than the first thickness. The second portion and the third portion may be respectively located on one side and the other side of the first portion in a first direction DR1. A surface of the first portion of the connection wire GSL_2 may protrude in the thickness direction compared to a surface of the second portion and a surface of the third portion. A central portion of a signal wire PAD disposed to overlap the first portion of the connection wire GSL_2 may protrude in the thickness direction.

Figure 33:
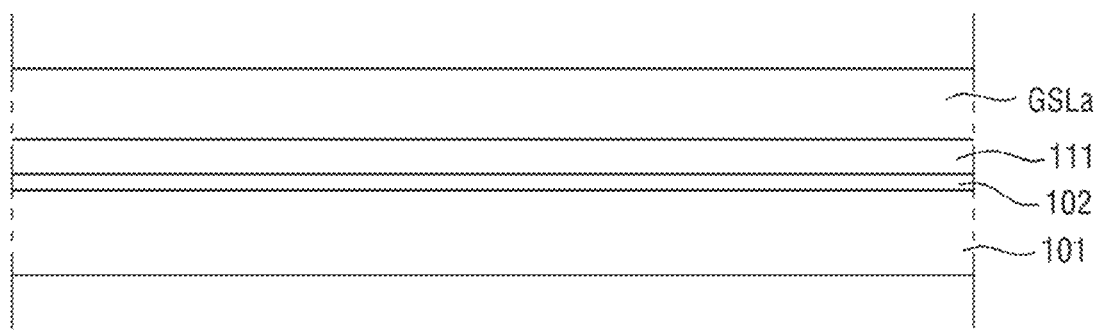
FIGS. 33 to 35 are cross-sectional views of a processing operation of a connection wire according to FIGS. 31 and 32.
Figure 34:
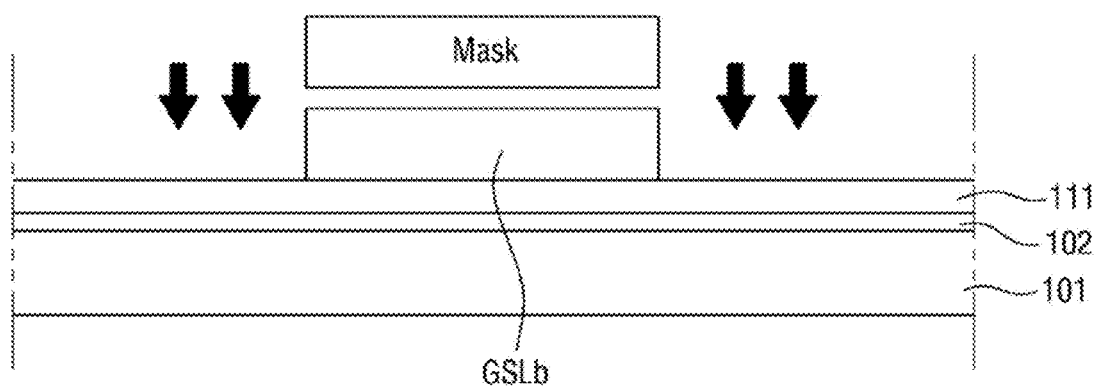
Figure 35:
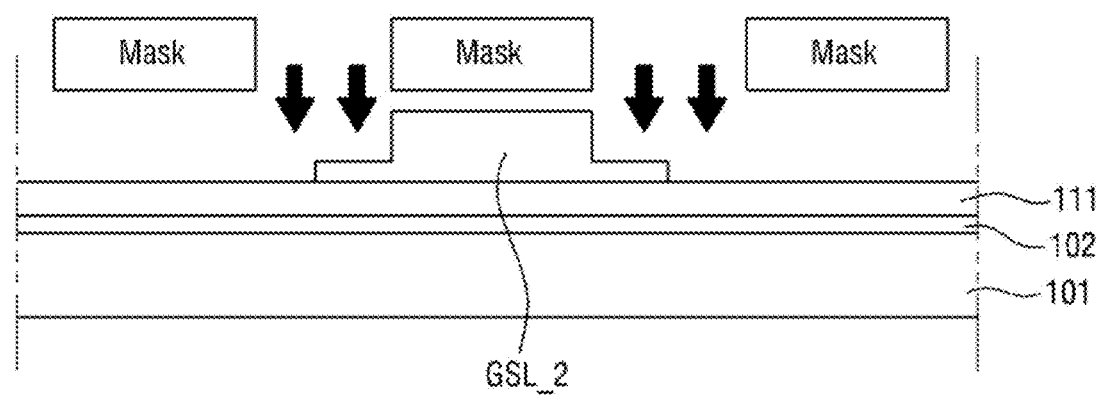

FIGS. 33 to 35 are cross-sectional views of a processing operation of the connection wire according to FIGS. 31 and 32.

Referring to FIG. 33, a connection wire material GSLa is deposited on a first insulating layer 111. The connection wire material GSLa may include at least one of the exemplified materials of the connection wire GSL described above with reference to FIG. 3.

Subsequently, referring to FIG. 34, a mask MASK is disposed on the connection wire material GSLa in an area in which the connection wire GSL_2 is to be formed, and the part of the connection wire material GSLa not overlapping the mask MASK is etched. The operation of etching the part of the connection wire material GSLa not overlapping the mask MASK may include an operation of dry etching the part of the connection wire material GSLa not overlapping the mask MASK or wet etching the part of the connection wire material GSLa not overlapping the mask MASK.

Subsequently, referring to FIG. 35, the mask MASK is disposed on the first portion of the connection wire GSL_2 and an area not overlapping the connection wire GSL_2, the area exposed by the mask MASK is etched to form the first to third portions of the connection wire GSL_2.

Although the embodiments of the present invention have been described above, the embodiments are merely examples and are not intended to limit the present invention. It should be understood by one of ordinary skill in the art that various modifications and applications which are not exemplified above may be made without departing from the essential features of the present invention. For example, the specific components described in the embodiments of the present invention may be implemented while being modified. In addition, it will be interpreted that differences related to the modifications and applications fall within the scope of the present invention defined by the appended claims.

The invention claimed is:

1. A display panel comprising:
a display substrate having a display area and a pad area disposed around the display area;
a connection wire disposed on the pad area of the display substrate;
a signal wire disposed on the connection wire;
an insulating layer disposed between the display substrate and the signal wire; and
a supporter disposed between the display substrate and the connection wire,
wherein the connection wire directly contacts the supporter,
wherein lowermost surfaces of the connection wire and the supporter are disposed directly on a same layer as each other,
wherein a planar size of the signal wire is greater than a planar size of the connection wire and a side surface of the signal wire extends further outward than a side surface of the connection wire in a plan view, and
wherein the insulating layer directly contacts a first portion of an inclined side surface of the connection wire and exposes an upper surface of the connection wire and a second portion of the inclined side surface of the connection wire.

2. The display panel of claim 1, wherein:
the planar size of the connection wire is greater than a planar size of the supporter; and
the connection wire covers the supporter.

3. The display panel of claim 2, wherein:
the signal wire directly contacts the connection wire.

4. The display panel of claim 1, wherein the signal wire directly contacts an upper surface of the insulating layer.

5. The display panel of claim 1, wherein a cross-sectional shape of the supporter includes a trapezoidal shape, a triangular shape, a pentagonal shape, a semicircular shape, a semi-elliptical shape, and/or a quadrangular shape.

6. The display panel of claim 1, wherein the supporter includes a plurality of patterns extending along a long-side direction of the signal wire and spaced apart from each other along a short-side direction of the signal wire.

7. The display panel of claim 1, wherein the supporter includes a plurality of patterns extending along a short-side direction of the signal wire and spaced apart from each other along a long-side direction of the signal wire.

8. The display panel of claim 1, wherein the supporter has a lattice shape extending along a long-side direction and a short-side direction of the signal wire in a plan view.

9. The display panel of claim 1, wherein the supporter has a shape of a plurality of islands disposed to be spaced apart along a long-side direction and a short-side direction of the signal wire in a plan view.

10. The display panel of claim 1, wherein:
the connection wire includes a plurality of connection wires; and
the display panel further comprises a non-conductive film or a non-conductive paste disposed between the plurality of connection wires.

11. A display panel comprising:
a display substrate having a display area and a pad area disposed around the display area;
a first connection wire disposed on the pad area of the display substrate; and
a signal wire disposed on the first connection wire,
wherein the first connection wire includes a first portion, a second portion disposed on a first side of the first portion, and a third portion disposed on a second side of the first portion that is opposite to the first side, the second and third portions each include an inclined surface,
wherein a surface height of the first portion is greater than a surface height of the second portion and a surface height of the third portion, and
wherein the signal wire directly contacts the first to third portions of the first connection wire and exposes lower surfaces of each of the inclined surfaces of the second and third portions of the first connection wire.

12. The display panel of claim 11, wherein:
the first connection wire includes a fourth portion disposed to overlap a first portion of the signal wire, a fifth portion disposed to overlap a second portion of the signal wire, and a sixth portion disposed to overlap a third portion of the signal wire,
wherein a thickness of the fourth portion is greater than a thickness of each of the fifth portion and the sixth portion.

13. The display panel of claim 11, further comprising:
a second connection wire disposed between the first connection wire and the signal wire,
wherein a planar size of the second connection wire is less than a planar size of the first connection wire and a planar size of the signal wire, and
the second connection wire is disposed to overlap a first portion of the signal wire in a thickness direction.

14. A display device comprising:
a display panel including a display substrate having a display area and a pad area disposed around the display area, a connection wire disposed on the pad area of the display substrate, a signal wire disposed on the connection wire, an insulating layer disposed between the display substrate and the signal wire, and a supporter disposed between the display substrate and the connection wire; and
a driving integrated circuit attached on the pad area of the display substrate and including a bump connected to the signal wire,
wherein the connection wire directly contacts the supporter, and
wherein lowermost surfaces of the connection wire and the supporter are disposed directly on a same layer as each other,
wherein a planar size of the signal wire is greater than a planar size of the connection wire and a side surface of the signal wire extends further outward than a side surface of the connection wire in a plan view, and
wherein the insulating layer directly contacts a first portion of an inclined side surface of the connection wire and exposes an upper surface of the connection wire and a second portion of the inclined side surface of the connection wire.

15. The display device of claim 14, wherein:
the planar size of the connection wire is greater than a planar size of the supporter; and
the connection wire covers the supporter.

16. The display device of claim 14, wherein:
the signal wire directly contacts the connection wire.

17. The display device of claim 14, wherein the signal wire directly contacts an upper surface of the insulating layer.

18. The display device of claim 16, wherein
the signal wire includes a first portion disposed to overlap the supporter, a second portion disposed not to overlap the supporter and located on a first side of the first portion, and a third portion disposed not to overlap the supporter and located on a second side of the first portion that is opposite to the first side,
wherein an upper surface of the first portion protrudes further from the display substrate than an upper surface of the second portion and an upper surface of the third portion in a thickness direction.

19. The display device of claim 18, wherein:
the driving integrated circuit further includes a driving substrate and a driving wire disposed on the driving substrate; and
the bump is disposed on the driving wire and connected to the driving wire.

20. The display device of claim 19, wherein
the bump includes a first portion, a second portion disposed on a first side of the first portion, and a third portion disposed a second side of the first portion that is opposite to the first side,
wherein a surface of the first portion is indented further than a surface of the second portion and a surface of the third portion in the thickness direction.

21. The display device of claim 20, wherein:
the first portion of the signal wire is connected to the first portion of the bump;
the second portion of the signal wire is connected to the second portion of the bump; and
the third portion of the signal wire is connected to the third portion of the bump.

22. The display device of claim 19, wherein the bump is directly connected to the signal wire.

23. The display device of claim 22, wherein the bump is ultrasonically connected to the signal wire.

24. A display panel comprising:
a display substrate having a display area and a pad area disposed around the display area;
a connection wire disposed on the pad area of the display substrate;
a supporter disposed between the display substrate and the connection wire and directly contacting the connection wire, the supporter protrudes a first portion of the connection wire in a direction further from the display substrate, wherein lowermost surfaces of the connection wire and the supporter are disposed directly on a same layer as each other;
a signal wire disposed on the connection wire, the signal wire including a first portion that overlaps the first portion of the connection wire, the first portion of the connection wire protruding the first portion of the signal wire in the direction further from the display substrate, wherein the first portion of the connection wire includes inclined surfaces having upper surfaces directly contacting the signal wire and lower surfaces exposed by the signal wire; and
a driving integrated circuit attached on the pad area of the display substrate and including a bump directly connected to the signal wire.

25. The display panel of claim 24, wherein the bump is ultrasonically connected to the signal wire.

26. An electronic device, comprising:
a display panel comprising:
a display substrate having a display area and a pad area disposed around the display area;
a connection wire disposed on the pad area of the display substrate;
a signal wire disposed on the connection wire;
an insulating layer disposed between the display substrate and the signal wire; and
a supporter disposed between the display substrate and the connection wire,
wherein the connection wire directly contacts the supporter,
wherein lowermost surfaces of the connection wire and the supporter are disposed directly on a same layer as each other,
wherein a planar size of the signal wire is greater than a planar size of the connection wire and a side surface of the signal wire extends further outward than a side surface of the connection wire in a plan view, and
wherein the insulating layer directly contacts a first portion of an inclined side surface of the connection wire and exposes an upper surface of the connection wire and a second portion of the inclined side surface of the connection wire.

* * * * *